(12) United States Patent
Yu et al.

(10) Patent No.: US 10,658,347 B2
(45) Date of Patent: May 19, 2020

(54) SEMICONDUCTOR PACKAGES AND METHODS OF FORMING THE SAME

(71) Applicant: Taiwan Semiconductor Manufacturing Company, Ltd., Hsinchu (TW)

(72) Inventors: Chen-Hua Yu, Hsinchu (TW); Jing-Cheng Lin, Hsinchu (TW); Po-Hao Tsai, Zhongli (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 16/229,062

(22) Filed: Dec. 21, 2018

(65) Prior Publication Data

US 2019/0115327 A1    Apr. 18, 2019

Related U.S. Application Data

(60) Continuation of application No. 15/401,930, filed on Jan. 9, 2017, now Pat. No. 10,163,872, which is a
(Continued)

(51) Int. Cl.
*H01L 21/00* (2006.01)
*H01L 25/10* (2006.01)
(Continued)

(52) U.S. Cl.
CPC .......... *H01L 25/105* (2013.01); *H01L 21/486* (2013.01); *H01L 21/4846* (2013.01);
(Continued)

(58) Field of Classification Search
CPC . H01L 25/105; H01L 23/498; H01L 23/5384; H01L 21/486; H01L 21/563;
(Continued)

(56) References Cited

U.S. PATENT DOCUMENTS 6,424,050 B1   7/2002   Komiyama
7,791,206 B2   9/2010   Takeuchi et al.
(Continued)

FOREIGN PATENT DOCUMENTS

CN     103972191 A      8/2014
JP     2013222966 A    10/2013
(Continued)

*Primary Examiner* — Vu A Vu
(74) *Attorney, Agent, or Firm* — Slater Matsil, LLP

(57) ABSTRACT

Embodiments of the present disclosure include semiconductor packages and methods of forming the same. An embodiment is a method including forming a first die package, the first die package including a first die, a first electrical connector, and a first redistribution layer, the first redistribution layer being coupled to the first die and the first electrical connector, forming an underfill over the first die package, patterning the underfill to have an opening to expose a portion of the first electrical connector, and bonding a second die package to the first die package with a bonding structure, the bonding structure being coupled to the first electrical connector in the opening of the underfill.

20 Claims, 25 Drawing Sheets

Related U.S. Application Data division of application No. 14/466,815, filed on Aug. 22, 2014, now Pat. No. 9,543,170.

(51) Int. Cl.

| | |
|---|---|
| *H01L 23/00* | (2006.01) |
| *H01L 21/56* | (2006.01) |
| *H01L 25/065* | (2006.01) |
| *H01L 21/683* | (2006.01) |
| *H01L 23/538* | (2006.01) |
| *H01L 21/48* | (2006.01) |
| *H01L 21/78* | (2006.01) |
| *H01L 23/29* | (2006.01) |
| *H01L 23/31* | (2006.01) |
| *H01L 23/498* | (2006.01) |
| *H01L 25/00* | (2006.01) |

(52) U.S. Cl.
CPC ........ *H01L 21/4853* (2013.01); *H01L 21/563* (2013.01); *H01L 21/568* (2013.01); *H01L 21/6835* (2013.01); *H01L 21/6836* (2013.01); *H01L 21/78* (2013.01); *H01L 23/29* (2013.01); *H01L 23/315* (2013.01); *H01L 23/3107* (2013.01); *H01L 23/3178* (2013.01); *H01L 23/498* (2013.01); *H01L 23/49827* (2013.01); *H01L 23/49838* (2013.01); *H01L 23/5384* (2013.01); *H01L 23/5389* (2013.01); *H01L 24/19* (2013.01); *H01L 24/97* (2013.01); *H01L 25/0657* (2013.01); *H01L 25/50* (2013.01); *H01L 23/49816* (2013.01); *H01L 24/32* (2013.01); *H01L 24/45* (2013.01); *H01L 24/48* (2013.01); *H01L 24/73* (2013.01); *H01L 24/92* (2013.01); *H01L 2221/68327* (2013.01); *H01L 2221/68359* (2013.01); *H01L 2221/68372* (2013.01); *H01L 2221/68381* (2013.01); *H01L 2221/68386* (2013.01); *H01L 2224/12105* (2013.01); *H01L 2224/19* (2013.01); *H01L 2224/32145* (2013.01); *H01L 2224/32225* (2013.01); *H01L 2224/45144* (2013.01); *H01L 2224/45147* (2013.01); *H01L 2224/48091* (2013.01); *H01L 2224/48227* (2013.01); *H01L 2224/73265* (2013.01); *H01L 2224/73267* (2013.01); *H01L 2224/83005* (2013.01); *H01L 2224/92244* (2013.01); *H01L 2224/97* (2013.01); *H01L 2225/0651* (2013.01); *H01L 2225/06568* (2013.01); *H01L 2225/1035* (2013.01); *H01L 2225/1041* (2013.01); *H01L 2225/1058* (2013.01); *H01L 2924/00014* (2013.01); *H01L 2924/15311* (2013.01); *H01L 2924/181* (2013.01); *H01L 2924/18162* (2013.01); *H01L 2924/3511* (2013.01)

(58) Field of Classification Search
CPC . H01L 21/78; H01L 25/0657; H01L 21/4853; H01L 25/50; H01L 21/4846; H01L 23/49838; H01L 23/49827; H01L 24/19; H01L 24/97; H01L 23/3178; H01L 23/29; H01L 23/3107; H01L 23/315; H01L 21/6835; H01L 21/6836; H01L 21/568; H01L 23/5389; H01L 24/73; H01L 2224/12105; H01L 2224/32145; H01L 2224/32225; H01L 2224/48091; H01L 2224/48227; H01L 24/48; H01L 24/32; H01L 2225/06568; H01L 23/49816; H01L 2224/83005; H01L 2224/73265; H01L 2224/73267; H01L 2224/92244; H01L 2224/97; H01L 2225/1041; H01L 24/92; H01L 2221/68386; H01L 24/45; H01L 2924/00014; H01L 2224/45147; H01L 2224/45144; H01L 2225/0651; H01L 2221/68381; H01L 2221/68372; H01L 2221/68359; H01L 2221/68327; H01L 2924/181; H01L 2924/3511; H01L 2924/18162; H01L 2924/15311; H01L 2225/1058; H01L 2225/1035; H01L 2224/19
USPC ........................................... 438/106
See application file for complete search history.

(56) References Cited

U.S. PATENT DOCUMENTS

| | | | |
|---|---|---|---|
| 8,017,436 B1 | 9/2011 | Huemoeller et al. | |
| 8,587,132 B2 | 11/2013 | Zhao et al. | |
| 8,779,606 B2* | 7/2014 | Yim | H01L 23/10 |
| | | | 257/790 |
| 10,163,872 B2* | 12/2018 | Yu | H01L 21/4846 |
| 2003/0183920 A1 | 10/2003 | Goodrich et al. | |
| 2004/0169275 A1 | 9/2004 | Danvir et al. | |
| 2006/0071337 A1 | 4/2006 | Shi et al. | |
| 2006/0231938 A1 | 10/2006 | Mangrum | |
| 2008/0017968 A1 | 1/2008 | Choi et al. | |
| 2010/0314741 A1 | 12/2010 | Lee et al. | |
| 2011/0133325 A1 | 6/2011 | Moon et al. | |
| 2011/0285005 A1 | 11/2011 | Lin et al. | |
| 2011/0316147 A1 | 12/2011 | Shih et al. | |
| 2012/0061854 A1 | 3/2012 | Chow et al. | |
| 2012/0074586 A1 | 3/2012 | Seo et al. | |
| 2012/0193812 A1* | 8/2012 | Toh | H01L 21/561 |
| | | | 257/774 |
| 2012/0211885 A1* | 8/2012 | Choi | H01L 23/3128 |
| | | | 257/737 |
| 2012/0319284 A1 | 12/2012 | Ko et al. | |
| 2013/0001760 A1* | 1/2013 | Ho | H01L 23/49503 |
| | | | 257/676 |
| 2013/0105989 A1 | 5/2013 | Pagaila et al. | |
| 2013/0249104 A1 | 9/2013 | Chi et al. | |
| 2013/0256894 A1 | 10/2013 | Adema | |
| 2013/0270685 A1 | 10/2013 | Yim et al. | |
| 2014/0091471 A1 | 4/2014 | Chen et al. | |

FOREIGN PATENT DOCUMENTS

| | | |
|---|---|---|
| KR | 20140043651 A | 4/2014 |
| TW | 201214626 A | 4/2012 |

\* cited by examiner

SEMICONDUCTOR PACKAGES AND METHODS OF FORMING THE SAME

PRIORITY CLAIM AND CROSS-REFERENCE

This application is a continuation of U.S. patent application Ser. No. 15/401,930, filed on Jan. 9, 2017, which is a divisional of U.S. patent application Ser. No. 14/466,815, filed on Aug. 22, 2014, (now U.S. Pat. No. 9,543,170, issued Jan. 10, 2017), which applications are hereby incorporated herein by reference.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

The semiconductor industry has experienced rapid growth due to improvements in the integration density of a variety of electronic components (e.g., transistors, diodes, resistors, capacitors, etc.). For the most part, this improvement in integration density has come from shrinking the semiconductor process node (e.g., shrink the process node towards the sub-20 nm node). As the demand for miniaturization, higher speed and greater bandwidth, as well as lower power consumption and latency has grown recently, there has grown a need for smaller and more creative packaging techniques of semiconductor dies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A through 1J illustrate cross-sectional views of intermediate steps in forming a first package in accordance with some embodiments.

DETAILED DESCRIPTION

Figure 1A:
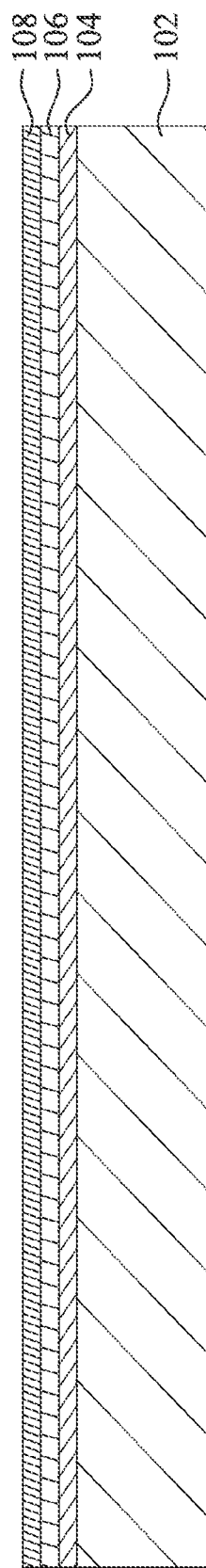

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will be described with respect to embodiments in a specific context, namely a three dimensional (3D) integrated fan-out (InFO) package-on-package (PoP) device. Other embodiments may also be applied, however, to other electrically connected components, including, but not limited to, package-on-package assemblies, die-to-die assemblies, wafer-to-wafer assemblies, die-to-substrate assemblies, in assembling packaging, in processing substrates, interposers, substrates, or the like, or mounting input components, boards, dies or other components, or for connection packaging or mounting combinations of any type of integrated circuit or electrical component.

FIGS. 1A through 1J illustrate cross-sectional views of intermediate steps in forming two first semiconductor packages 100 in accordance with some embodiments. The first semiconductor packages in FIG. 1A includes an adhesive layer 104 over a carrier substrate 102, a dielectric layer 106 over the adhesive layer 104, and a seed layer 108 over the dielectric layer 106. The carrier substrate 102 may be any suitable substrate that provides (during intermediary operations of the fabrication process) mechanical support for the layers over the carrier substrate 102. The carrier substrate 102 may be a wafer including glass, silicon (e.g., a silicon wafer), silicon oxide, metal plate, a ceramic material, or the like.

The adhesive layer 104 may be disposed, for example laminated, on the carrier substrate 102. The adhesive layer 104 may be formed of a glue, such as an ultra-violet (UV) glue, a light-to-heat conversion (LTHC) material, or may be a lamination layer formed of a foil.

The dielectric layer 106 is formed over the adhesive layer 104. The dielectric layer 106 can be silicon nitride, silicon carbide, silicon oxide, low-k dielectrics such as carbon doped oxides, extremely low-k dielectrics such as porous carbon doped silicon dioxide, a polymer, such as an epoxy, polyimide, benzocyclobutene (BCB), polybenzoxazole (PBO), the like, or a combination thereof, although other relatively soft, often organic, dielectric materials can also be used. The dielectric layer 106 may be deposited by chemical vapor deposition (CVD), physical vapor deposition (PVD), atomic layer deposition (ALD), a spin-on-dielectric process, the like, or a combination thereof.

The seed layer 108 is formed over the dielectric layer 106. The seed layer 108 may be made of copper, titanium, nickel, gold, the like, or a combination thereof. The seed layer 108 may be deposited by PVD, CVD, ALD, the like, or a combination thereof.

Figure 1B:
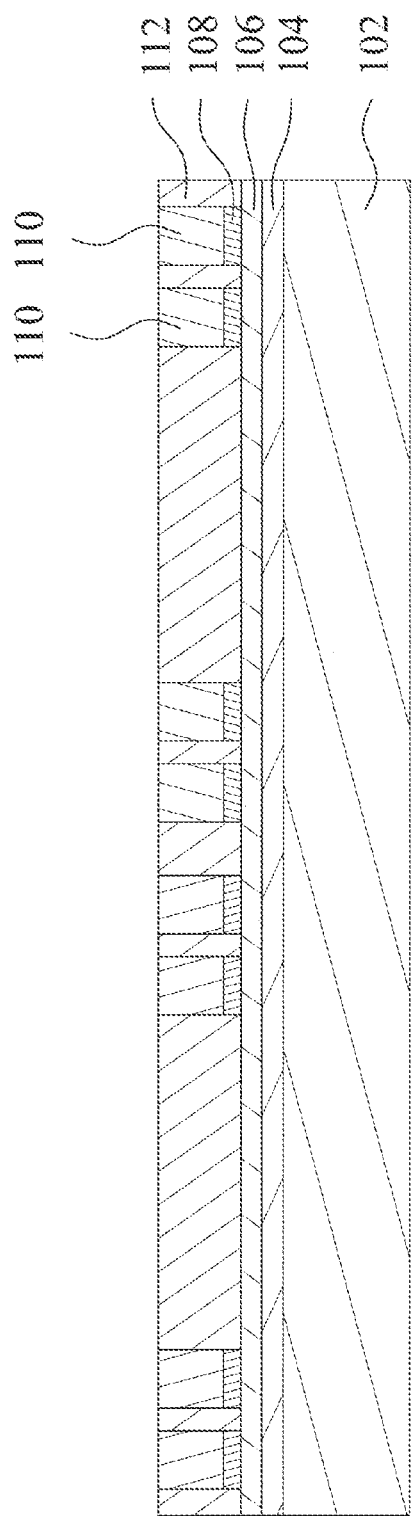

FIG. 1B illustrates patterning the seed layer 108 and the formation of the electrical connectors 110. The seed layer 108 may be patterned by an etch process or any other suitable patterning process.

The electrical connectors 110 may be formed over the seed layer 108 and extend from the seed layer 108 in a direction that is substantially perpendicular to a surface of the dielectric layer 106. In some embodiments, the electrical connectors 110 are formed through electrical plating. In these embodiments, the electrical connectors 110 are made of copper, aluminum, nickel, gold, silver, palladium, tin, the like, or a combination thereof, and may have a composite structure including a plurality of layers. In these embodiments, a sacrificial layer 112, such as a photoresist, is formed over the carrier substrate. In some embodiments, the photoresist 112 is formed and patterned on the seed layer 108 and then the electrical connectors 110 are formed in the patterned photoresist 112. The photoresist 112 may be formed by a wet process, such as a spin-on process, or by a dry process, such as by applying a dry film. A plurality of openings are formed in the photoresist 112 to expose the underlying seed layer 108. A plating step is then performed to plate the electrical connectors 110.

In alternative embodiments, the electrical connectors 110 may be stud bumps, which are formed by wire bonding over the dielectric layer 106, and cutting the bond wire with a portion of bond wire left attached to the respective bond ball. For example, the electrical connectors 110 may include a lower portion and an upper portion, wherein the lower portion may be a bond ball (not shown) formed in the wire bonding, and the upper portion may be the remaining bond wire (not shown). The upper portion of the electrical connector 110 may have a uniform width and a uniform shape that are uniform throughout the top part, the middle part, and the bottom part of upper portion. The electrical connectors 110 may be formed of non-solder metallic materials that can be bonded by a wire bonder. In some embodiments, the electrical connectors 110 are made of copper wire, gold wire, the like, or a combination thereof, and may have a composite structure including a plurality of layers. In the wire bonding embodiments, the seed layer 108 and the sacrificial layer 112 may be omitted.

The electrical connectors 110 may form a backside redistribution layer for the first package. This backside redistribution layer may be used to couple another package(s) or component(s) (see FIG. 2A) to the first packages.

Figure 1C:
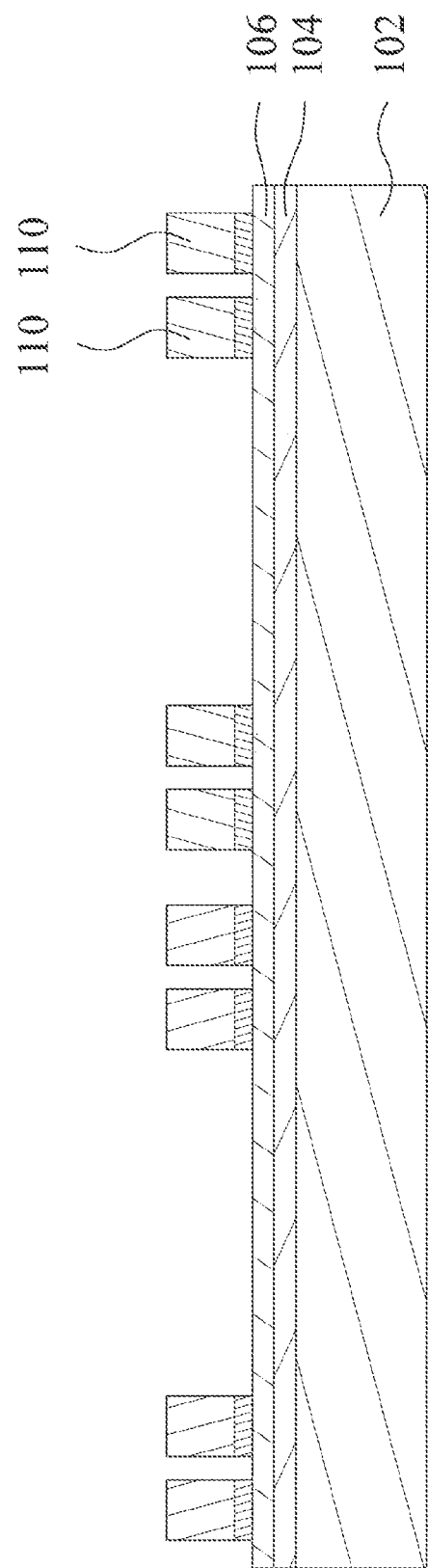

FIG. 1C illustrates the removal of the sacrificial layer 112. The sacrificial layer 112 may be removed through a suitable removal process such as ashing or an etch process.

Figure 1D:
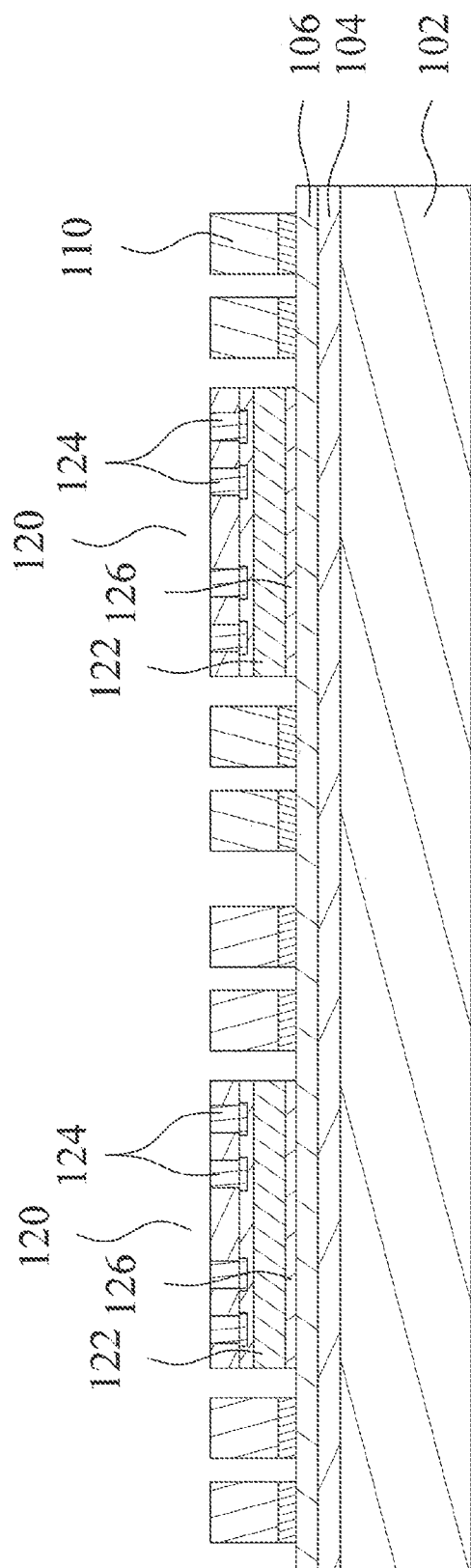

FIG. 1D illustrates attaching dies 120 to the dielectric layer 106. First sides of the dies 120 may be attached to the dielectric layer 106 with an adhesive layer 126. The adhesive layer 126 may be any suitable adhesive, such as a die attach film or the like. The dies 120 may be a single die or may be more than two dies. The dies 120 may include a logic die, such as a central processing unit (CPU), a graphics processing unit (GPU), the like, or a combination thereof. In some embodiments, the dies 120 include a die stack (not shown) which may include both logic dies and memory dies. The dies 120 may include an input/output (I/O) die, such as a wide I/O die that provides a connection between the first package 10 and the subsequently attached second package 200 (see FIG. 2A).

The dies 120 include contact areas 124 on a second side of the dies 120. In some embodiments, the contact areas 124 are bond pads. The bond pads 124 may be formed over the second side of the dies 120. In some embodiments, the bond pads 124 are formed by forming recesses (not shown) into a dielectric layer (not shown) on the second side of the dies 120. The recesses may be formed to allow the bond pads 124 to be embedded into the dielectric layer. In other embodiments, the recesses are omitted as the bond pads 124 may be formed the dielectric layer. The bond pads 124 electrically and/or physically couple the dies 120 to the subsequently bonded second packages 200 (see FIG. 2A), and/or the electrical connectors 110. In some embodiments, the bond pads 124 include a thin seed layer (not shown) made of copper, titanium, nickel, gold, tin, the like, or a combination thereof. The conductive material of the bond pads 124 may be deposited over the thin seed layer. The conductive material may be formed by an electro-chemical plating process, CVD, ALD, PVD, the like, or a combination thereof. In an embodiment, the conductive material of the bond pads 124 is copper, tungsten, aluminum, silver, gold, tin, the like, or a combination thereof.

In an embodiment, the contact areas 124 are underbump metallizations (UBMs) that include three layers of conductive materials, such as a layer of titanium, a layer of copper, and a layer of nickel. However, one of ordinary skill in the art will recognize that there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the UBMs 124. Any suitable materials or layers of material that may be used for the UBMs 124 are fully intended to be included within the scope of the current application.

Figure 1E:
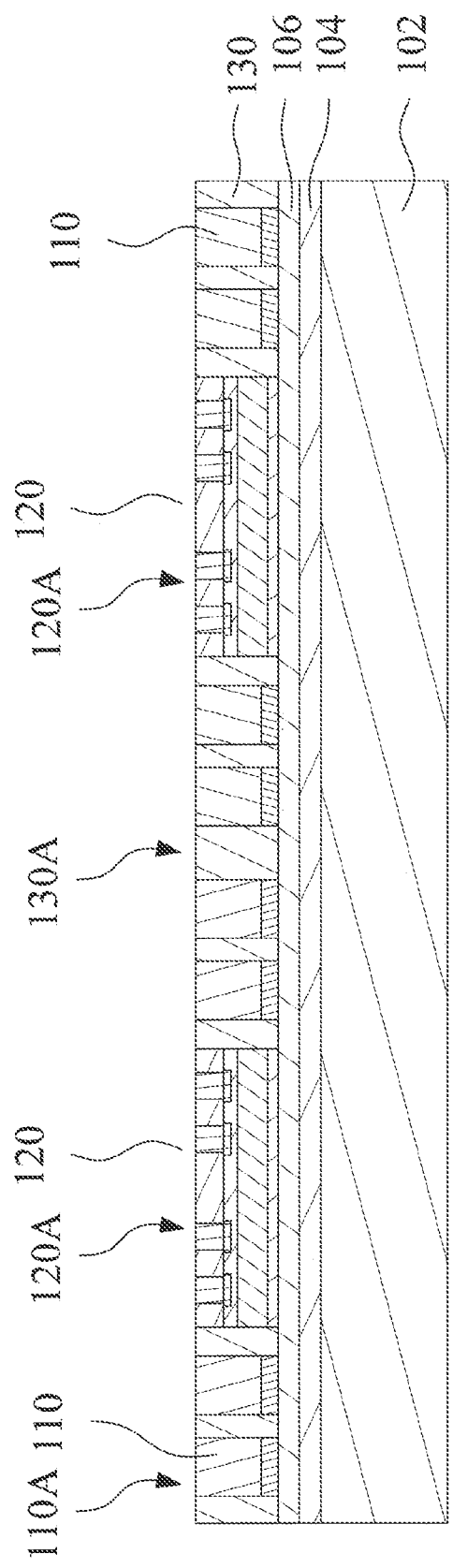

FIG. 1E illustrates the encapsulation of the dies 120 and the electrical connectors 110. In some embodiments, the dies 120 and the electrical connectors 110 are encapsulated by a molding material 130. The molding material 130 may be molded on the dies 120 and the electrical connectors 110, for example, using compression molding. In some embodiments, the molding material 130 is made of a molding compound, a polymer, an epoxy, silicon oxide filler material, the like, or a combination thereof. A curing step may be performed to cure the molding material 130, wherein the curing may be a thermal curing, a UV curing, the like, or a combination thereof.

In some embodiments, the dies 120, the contact areas 124, and the electrical connectors 110 are buried in the molding material 130, and after the curing of the molding material 130, a planarization step, such as a grinding, is performed on the molding material 130 as illustrated in FIG. 1E. The planarization step is used to remove excess portions of the molding material 130, which excess portions are over top surfaces of the contact areas 124 and the electrical connectors 110. In some embodiments, surfaces of the contact areas 124 and surfaces 110A of the electrical connectors 110 are exposed, and are level with a surface 130A of the molding material 130 and a surface 120A of the dies 120. The electrical connectors 110 may be referred to as through molding vias (TMVs), through package vias (TPVs), and/or through InFO vias (TIVs) and will be referred to as TIVs 110 hereinafter.

In other embodiments, the contact areas 124 are vias extending from the second side of the dies 120 partially into the dies 120, or, in some embodiments, the vias extend completely through the dies 120. The vias 124 may be formed by an etch process to form holes (not shown) in the dies 120 and the holes may be filled by a conductive material such as copper, aluminum, nickel, gold, silver, palladium, tin, the like, or a combination thereof, and may have a composite structure including a plurality of layers. The dies 120 may also include seed layers, barrier layers, liners, the like, or a combination thereof.

Figure 1F:
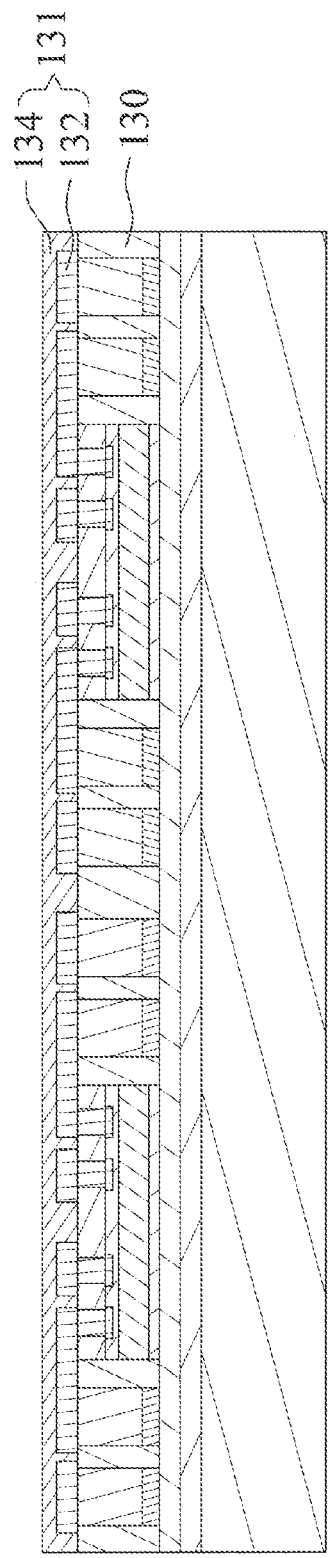

FIG. 1F illustrates forming a redistribution layer 131 over the dies 120, the TIVs 110, and the molding material 130. The redistribution layer 131 may include one or more metal layers, sometimes referred to as $M_1$ and/or $M_N$, wherein the metal layer $M_1$ is the metal layer immediately adjacent the dies 120, and metal layer $M_N$ (sometimes referred to as the top metal layer $M_N$) is the metal layer furthest from the dies 120. Throughout the description, the term "metal layer" refers to the collection of metal lines 132 in the same layer. The redistribution layer 131 may include one or more passivation layers 134, wherein the one or more metal layers ($M_1$ through $M_N$) are disposed in the one or more passivation layers 134.

The passivation layers 134 can be silicon nitride, silicon carbide, silicon oxide, low-k dielectrics such as carbon doped oxides, extremely low-k dielectrics such as porous carbon doped silicon dioxide, a polymer, such as an epoxy, polyimide, BCB, PBO, solder resist (SR), the like, or a combination thereof, although other relatively soft, often organic, dielectric materials can also be used, and deposited by CVD, PVD, ALD, a spin-on-dielectric process, a lamination process, the like, or a combination thereof. The passivation layers 134 may undergo a curing step to cure the passivation layers 134, wherein the curing may be a thermal curing, a UV curing, the like, or a combination thereof.

The metal layers 132 may be formed using a single and/or a dual damascene process, a via-first process, or a metal-first process. The metal layers and vias 132 may be formed of a conductive material, such as copper, aluminum, titanium, the like, or a combination thereof, with or without a barrier layer.

A damascene process is the formation of a patterned layer embedded in another layer such that the top surfaces of the two layers are coplanar. A damascene process, which creates either only trenches or vias, is known as a single damascene process. A damascene process, which creates both trenches and vias at once, is known as a dual damascene process.

In an exemplary embodiment, the metal layers 132 are formed using a dual damascene process. In this example, the formation of the $M_1$ layer may begin with the formation of an etch stop layer (not shown) on the lowermost passivation layer 134 and with the next passivation layer 134 on the etch stop layer. Once the next passivation layer 134 is deposited, portions of the next passivation layer 134 may be etched away to form recessed features, such as trenches and vias, which can be filled with conductive material to connect different regions of the redistribution layer 134 and accommodate the metal lines 132 and vias. This process may be repeated for the remaining metal layers through $M_N$.

The redistribution layer 131 may be referred to as a frontside redistribution layer for the first package 100. This frontside redistribution layer 131 may be utilized to couple the first package 100 via the connectors 136 to one or more packages, package substrates, components, the like, or a combination thereof (see FIG. 1G).

The number of metal layers 132 and the number of passivation layers 134 are only for illustrative purposes and are not limiting. There could be other number of layers that is more or less than the one metal layer illustrated. There may be other number of passivation layers, and other number of metal layers different from those illustrated in FIG. 1F.

Figure 1G:
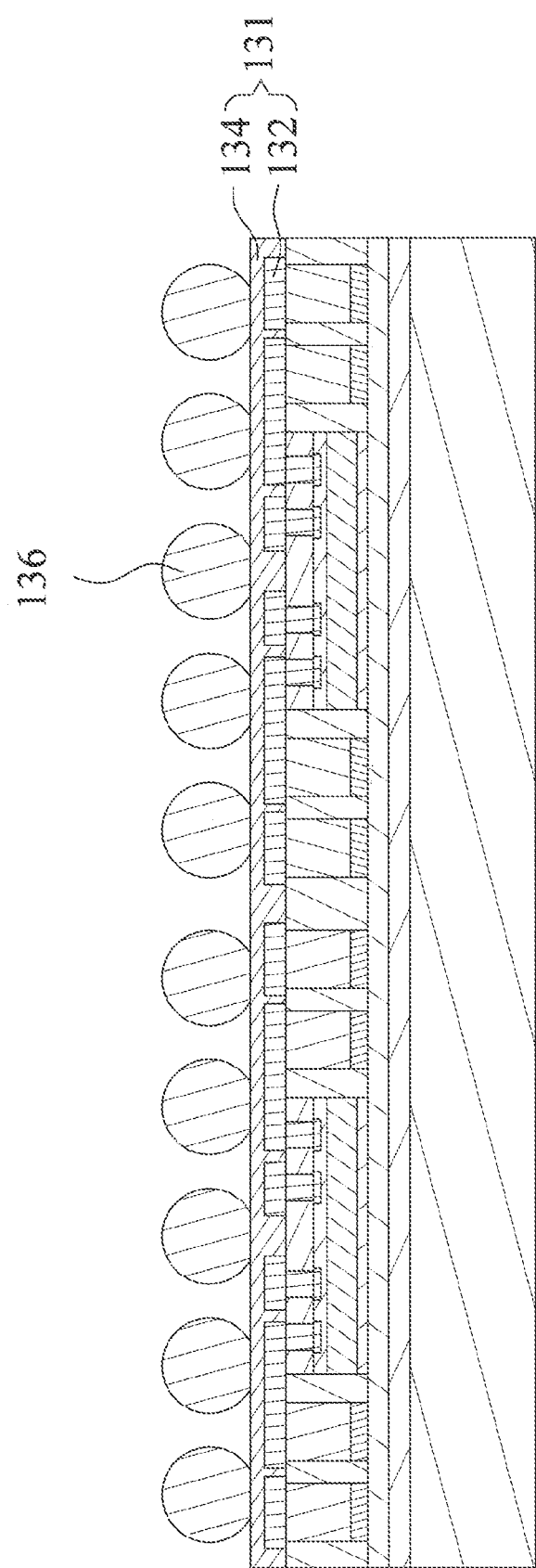

FIG. 1G illustrates the formation of a set of conductive connectors 136 over and electrically coupled to the redistribution layer 131. The conductive connectors 136 may be solder balls, metal pillars, controlled collapse chip connection (C4) bumps, micro bumps, electroless nickel-electroless palladium-immersion gold technique (ENEPIG) formed bumps, or the like. The conductive connectors 136 may include a conductive material such as solder, copper, aluminum, gold, nickel, silver, palladium, tin, the like, or a combination thereof. In an embodiment in which the conductive connectors 136 are solder bumps, the conductive connectors 136 are formed by initially forming a layer of solder through such commonly used methods such as evaporation, electroplating, printing, solder transfer, ball placement, or the like. Once a layer of solder has been formed on the structure, a reflow may be performed in order to shape the material into the desired bump shapes. In another embodiment, the conductive connectors 136 are metal pillars (such as a copper pillar) formed by a sputtering, printing, electro plating, electroless plating, CVD, or the like. The metal pillars may be solder free and have substantially vertical sidewalls. In some embodiments, a metal cap layer (not shown) is formed on the top of the metal pillar connectors 136. The metal cap layer may include nickel, tin, tin-lead, gold, silver, palladium, indium, nickel-palladium-gold, nickel-gold, the like, or a combination thereof and may be formed by a plating process.

Although not shown, there may be UBMs coupled to the redistribution layer 131 with the conductive connectors 136 coupled to the UBMs (not shown). The UBMs may be formed by first forming a set of openings (not shown) may be formed through the topmost passivation layer 134 to expose surfaces of the metal lines 132 in the metal layer $M_N$. The UBMs may extend through these openings in the passivation layer 134 and also extend along a surface of passivation layer 134. The UBMs may include three layers of conductive materials, such as a layer of titanium, a layer of copper, and a layer of nickel. However, one of ordinary skill in the art will recognize that there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the UBMs. Any suitable materials or layers of material that may be used for the UBMs are fully intended to be included within the scope of the current application.

Figure 1H:
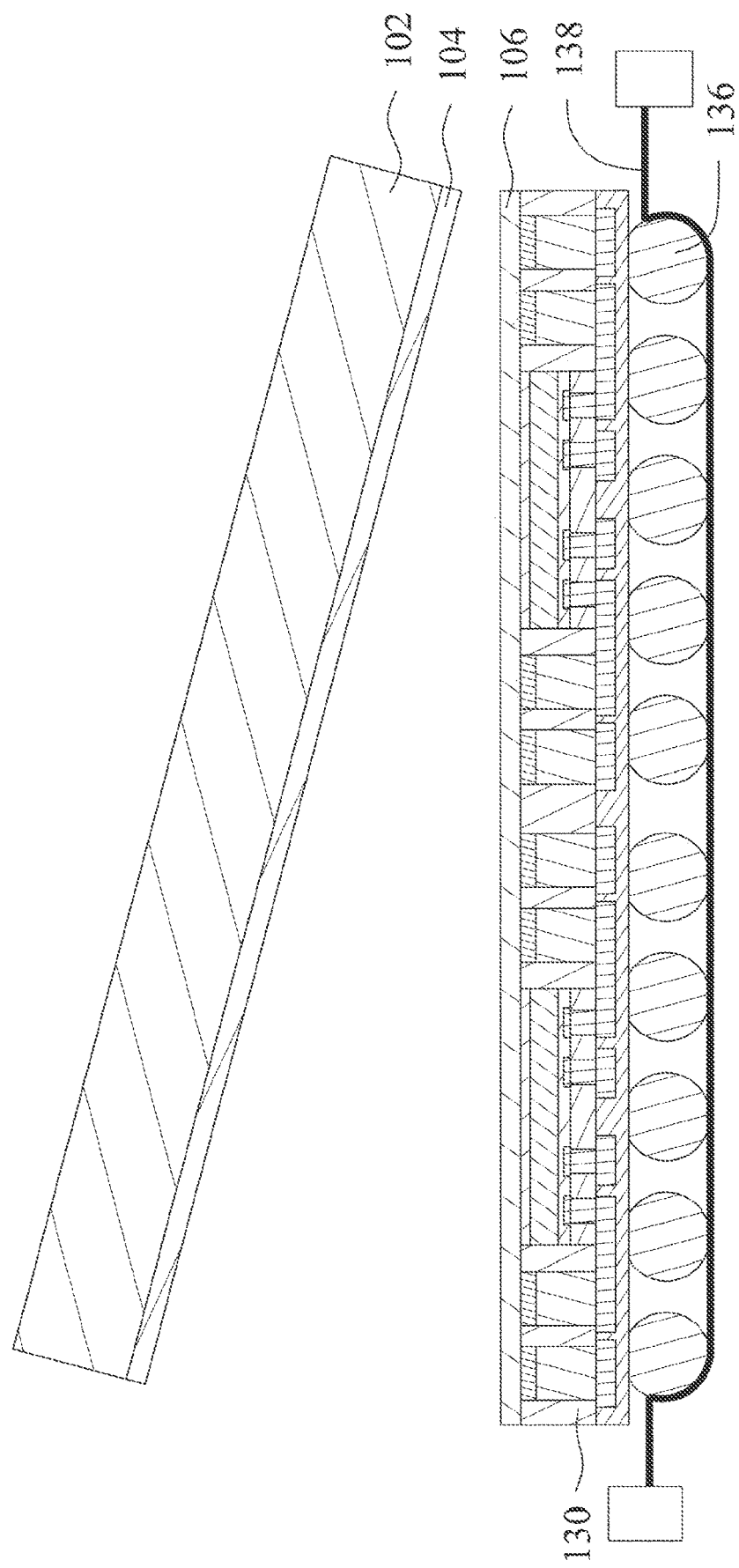
Figure 11:
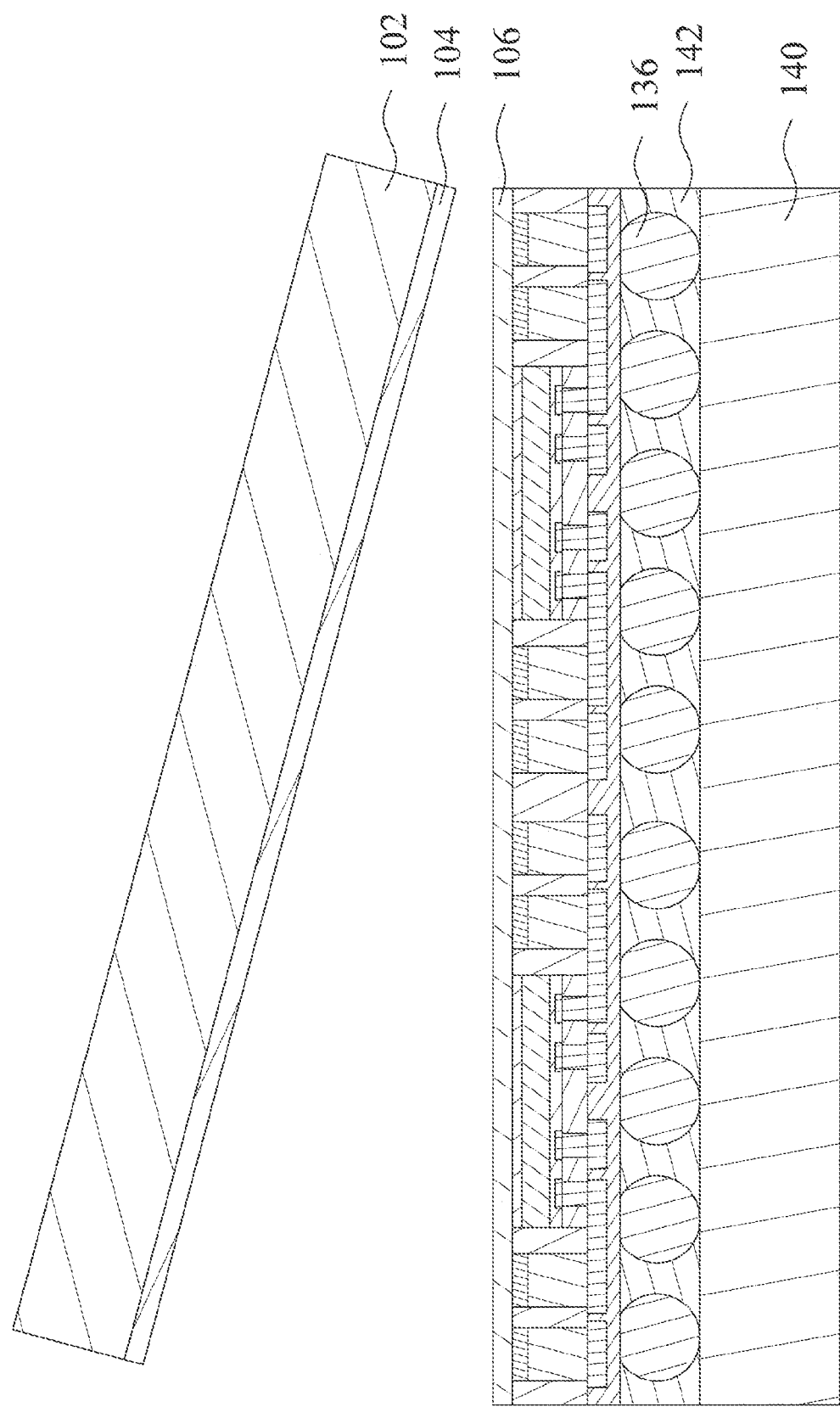

FIG. 1H illustrates removing the carrier substrate 102 and the adhesive layer 104 to expose the dielectric layer 106 according to an embodiment. In this embodiment, the first package is placed on a frame 138 with the conductive connectors 136 adjoining the frame 138 while the carrier substrate 102 and the adhesive layer 104 are removed.

FIG. 1I illustrates removing the carrier substrate 102 and the adhesive layer 104 to expose the dielectric layer 106 according to another embodiment. In this embodiment, the first package is placed on a second carrier substrate 140 with the conductive connectors 136 adjoining the second carrier substrate 140 while the carrier substrate 102 and the adhesive layer 104 are removed. This embodiment may include a peelable glue 142 on the second carrier substrate 140 with the conductive connectors 136 being embedded in the peelable glue 142. The peelable glue 142 may help to secure the first package 100 to the second carrier substrate 140. After the carrier substrate 102 is removed, the peelable glue 142 may be removed by a peel-off method that includes a thermal process, a chemical strip process, laser removal, a UV treatment, the like, or a combination thereof.

Figure 1J:
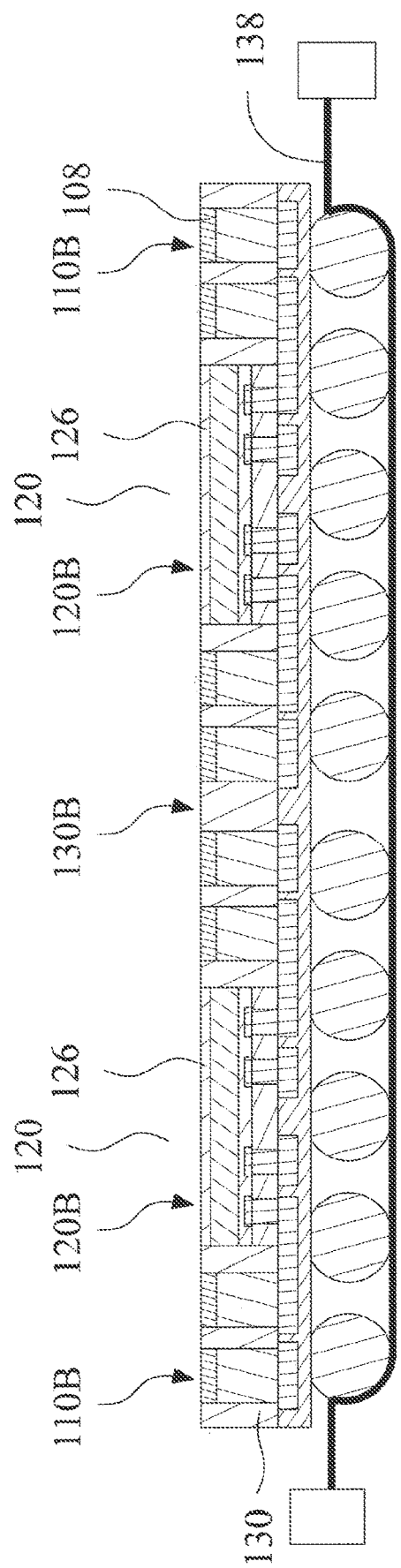

FIG. 1J illustrates the removal of the dielectric layer 106. The dielectric layer 106 may be removed through a suitable removal process such as an etch process. After the dielectric layer 106 is removed, portions of the dies 120 and the TIVs 110 are exposed. Backside surfaces 110B of the TIVs 110 are exposed, which may include the seed layers 108. In addition, backside surfaces 120B of the dies 120 are exposed, which may include the adhesive layers 126. In some embodiments, the TIVs 110 may be recessed by, for example, an etch process after the dielectric layer 106 is removed. In some embodiments, the adhesive layer 126 is removed to expose the surfaces of the dies 120. In other embodiments, the adhesive layer 126 was not used when attaching the dies 120 to the carrier substrate 102 (see FIG. 1C). In some embodiments, the surfaces 130B and 120B are substantially coplanar and higher than the surfaces 110B. In other words, the TIVs 110 may be recessed in the molding material 130.

Figure 2A:
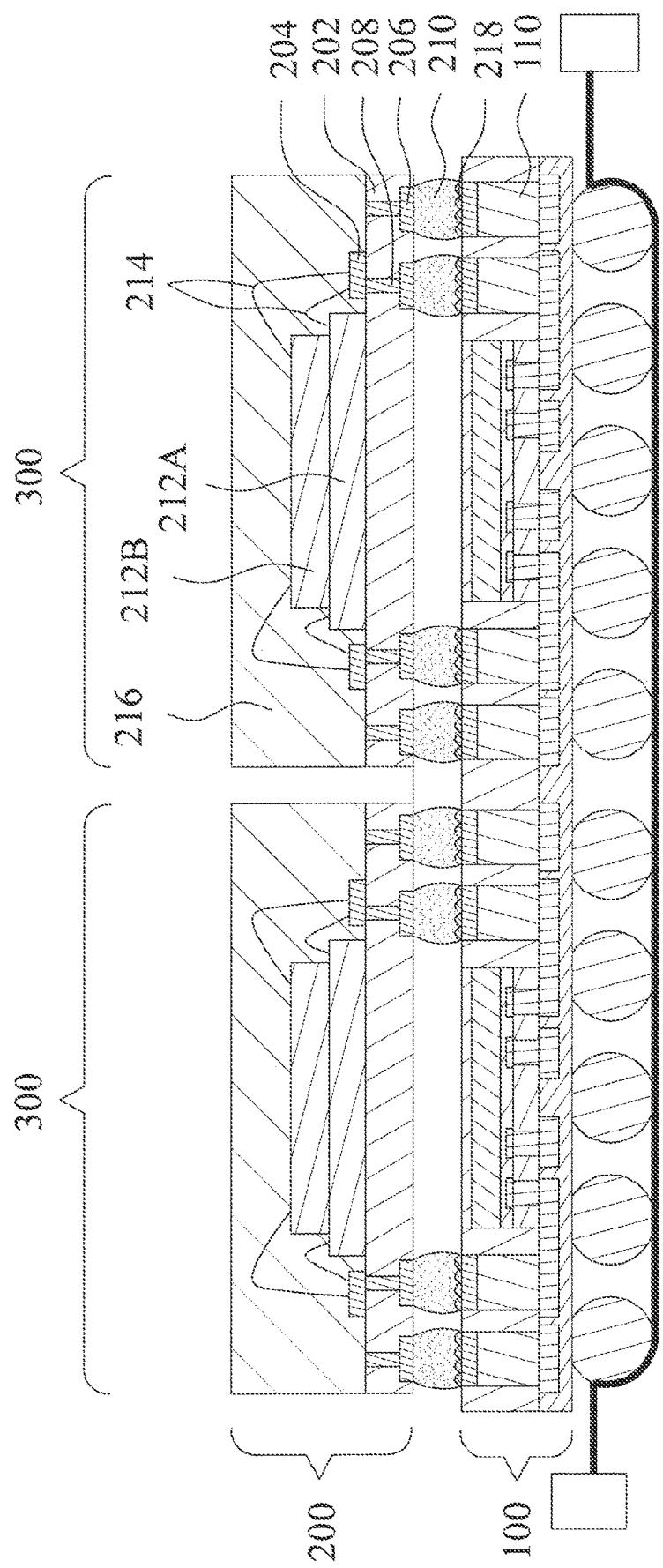
FIGS. 2A through 2C illustrate cross-sectional views of intermediate steps of attaching a second package to the first package of FIGS. 1A through 1J and singulating the packages into semiconductor packages in accordance with some embodiments.
Figure 2B:
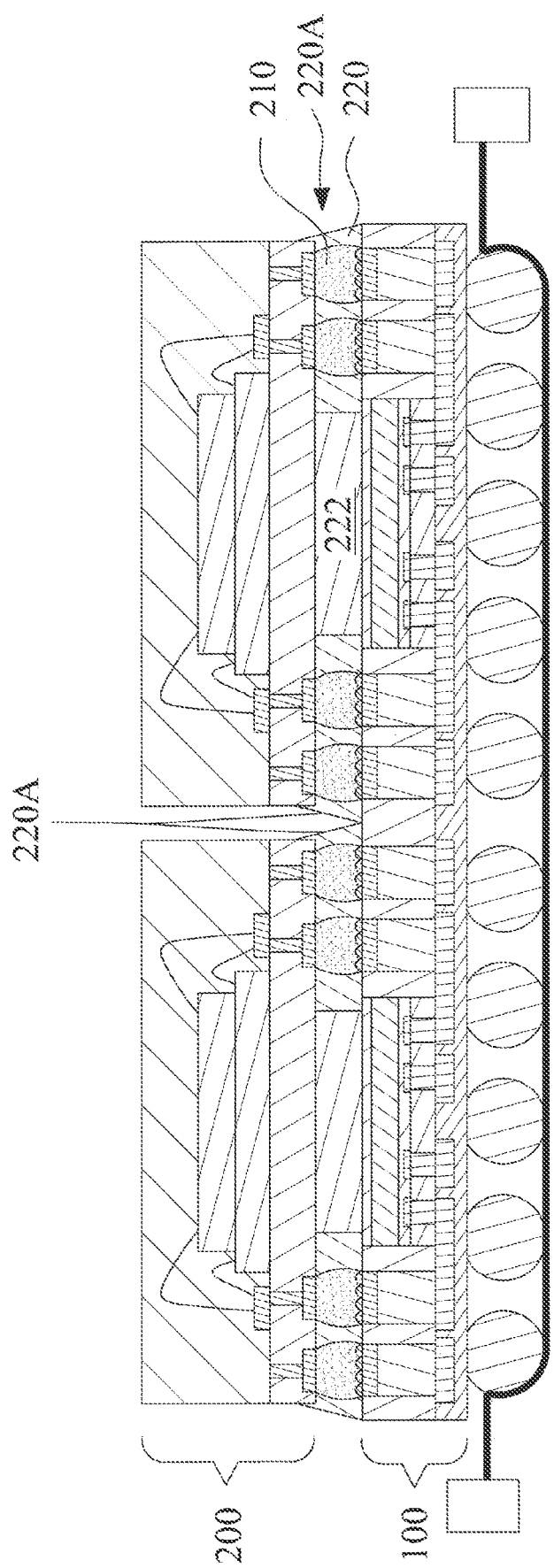
Figure 2C:
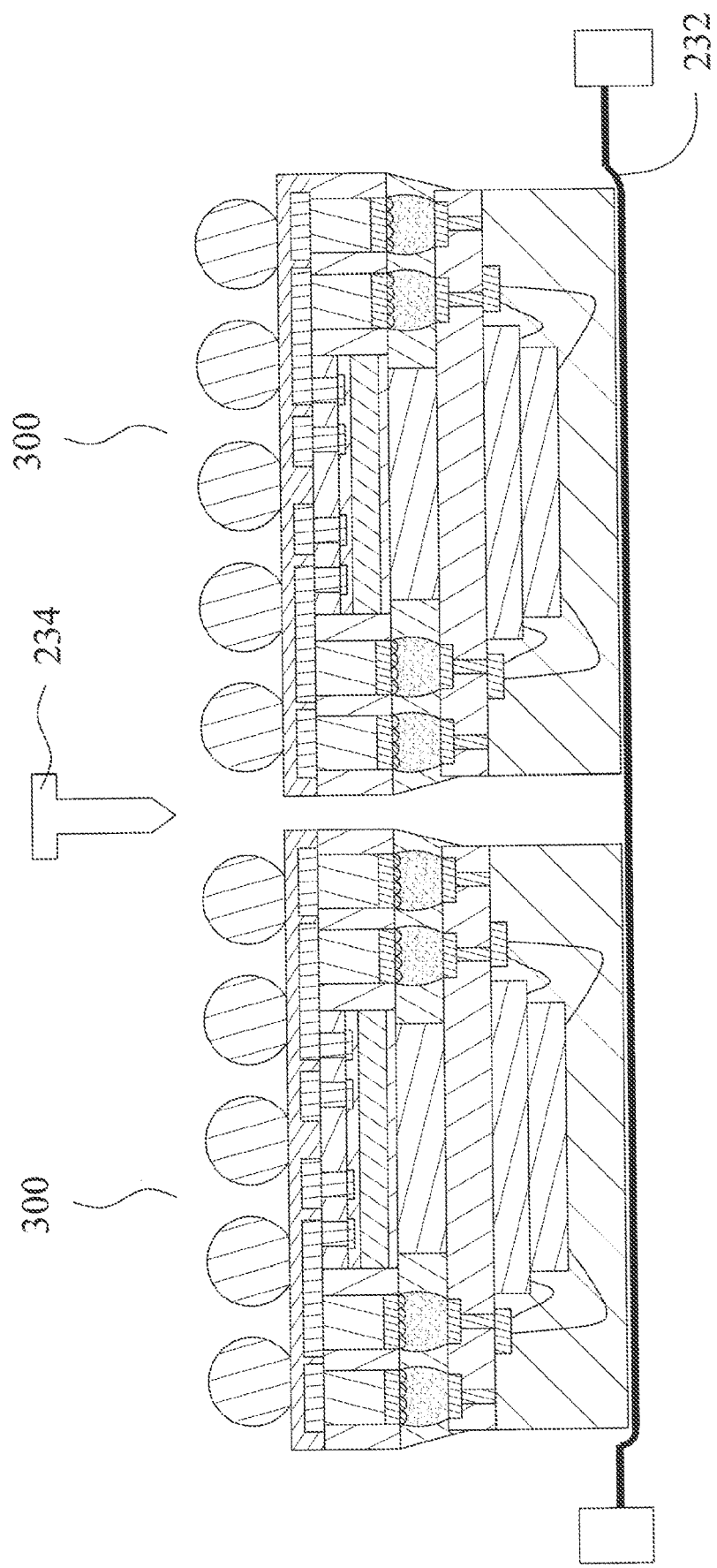

FIGS. 2A through 2C illustrate cross-sectional views of intermediate steps of attaching a second package to the first package formed in FIGS. 1A through 1J and singulating the packages into semiconductor packages in accordance with some embodiments. Referring to FIG. 2A, second packages 200 are bonded to the first package 100 with a set of conductive connectors 210 forming semiconductor packages 300.

The second packages 200 each include a substrate 202 and one or more stacked dies 212 (212A and 212B) coupled to the substrate 202. The substrate 202 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 202 may be a silicon-on-insulator (SOI) substrate. Generally, an SOI substrate includes a layer of a semiconductor material such as epitaxial silicon, germanium, silicon germanium, SOI, silicon germanium on insulator (SGOI), or combinations thereof. The substrate 202 is, in one alternative embodiment, based on an insulating core such as a fiberglass reinforced resin core. One example core material is fiberglass resin such as FR4. Alternatives for the core material include bismaleimide-triazine (BT) resin, or alternatively, other printed circuit board (PCB) materials or films. Build up films such as Ajinomoto build-up film (ABF) or other laminates may be used for substrate 202. The substrate 202 may be referred to as a package substrate 202.

The substrate 202 may include active and passive devices (not shown in FIG. 2A). As one of ordinary skill in the art will recognize, a wide variety of devices such as transistors, capacitors, resistors, combinations of these, and the like may be used to generate the structural and functional requirements of the design for the semiconductor package 300. The devices may be formed using any suitable methods.

The substrate 202 may also include metallization layers (not shown) and through vias 208. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the substrate 202 is substantially free of active and passive devices.

The substrate 202 may have bond pads 204 on a first side the substrate 202 to couple to the stacked dies 212, and bond pads 206 on a second side of the substrate 202, the second side being opposite the first side of the substrate 202, to couple to the conductive connectors 210. In some embodiments, the bond pads 204 and 206 are formed by forming recesses (not shown) into dielectric layers (not shown) on the first and second sides of the substrate 202. The recesses may be formed to allow the bond pads 204 and 206 to be embedded into the dielectric layers. In other embodiments, the recesses are omitted as the bond pads 204 and 206 may be formed on the dielectric layer. In some embodiments, the bond pads 204 and 206 include a thin seed layer (not shown) made of copper, titanium, nickel, gold, palladium, the like, or a combination thereof. The conductive material of the bond pads 204 and 206 may be deposited over the thin seed layer. The conductive material may be formed by an electrochemical plating process, an electroless plating process, CVD, ALD, PVD, the like, or a combination thereof. In an embodiment, the conductive material of the bond pads 204 and 206 is copper, tungsten, aluminum, silver, gold, the like, or a combination thereof.

In an embodiment, the bond pads 204 and 206 are UBMs that include three layers of conductive materials, such as a layer of titanium, a layer of copper, and a layer of nickel. However, one of ordinary skill in the art will recognize that there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the UBMs 204 and 206. Any suitable materials or layers of material that may be used for the UBMs 204 and 206 are fully intended to be included within the scope of the current application. In some embodiments, the through vias 208 extend through the substrate 202 and couple at least one bond pad 204 to at least one bond pad 206.

In the illustrated embodiment, the stacked dies 212 are coupled to the substrate 202 by wire bonds 214, although other connections may be used, such as conductive bumps. In an embodiment, the stacked dies 212 are stacked memory dies. For example, the stacked memory dies 212 may include low-power (LP) double data rate (DDR) memory modules, such as LPDDR1, LPDDR2, LPDDR3, or the like memory modules.

In some embodiments, the stacked dies 212 and the wire bonds 214 may be encapsulated by a molding material 216. The molding material 216 may be molded on the stacked dies 212 and the wire bonds 214, for example, using compression molding. In some embodiments, the molding material 216 is a molding compound, a polymer, an epoxy, silicon oxide filler material, the like, or a combination thereof. A curing step may be performed to cure the molding material 216, wherein the curing may be a thermal curing, a UV curing, the like, or a combination thereof.

In some embodiments, the stacked dies 212 and the wire bonds 214 are buried in the molding material 216, and after the curing of the molding material 216, a planarization step, such as a grinding, is performed to remove excess portions of the molding material 216 and provide a substantially planar surface for the second packages 200.

After the second packages 200 are formed, the packages 200 are bonded to the first packages 100 by way of conductive connectors 210, the bond pads 206, and the TIVs 110. In some embodiments, the stacked memory dies 212 may be coupled to the dies 120 through the wire bonds 214, the bond pads 204 and 206, through vias 208, the conductive connectors 210, and the TIVs 110.

The conductive connectors 210 may be similar to the conductive connectors 136 described above and the description is not repeated herein, although the conductive connectors 210 and 136 need not be the same. In some embodiments, before bonding the conductive connectors 210, the conductive connectors 210 are coated with a flux (not shown), such as a no-clean flux. The conductive connectors 210 may be dipped in the flux or the flux may be jetted onto the conductive connectors 210. In another embodiment, the flux may be applied to the surfaces of the TIVs 110.

The bonding between the second package 200 and the first package 100 may be a solder bonding or a direct metal-to-metal (such as a copper-to-copper or tin-to-tin) bonding. In an embodiment, the second package 200 is bonded to the first package 100 by a reflow process. During this reflow process, the conductive connectors 210 are in contact with the bond pads 206 and the TIVs 110 to physically and electrically couple the second package 200 to the first package 100. After the bonding process, an intermetallic compound (IMC) 218 may form at the interface of the TIVs 110 and the conductive connectors 210 and also at the interface between the conductive connectors 210 and the bond pads 206 (not shown).

FIG. 2B illustrates forming an underfill 220 between the first package 100 and the second package 200 and between the conductive connectors 210. The underfill 220 may be formed of a liquid epoxy, a deformable gel, a silicon rubber, a non-conductive film, a polymer, PBO, polyimide, solder resist, or a combination thereof. The underfill 220 provides structural support for the conductive connectors 210, and may be dispensed using capillary force after the conductive connectors 210 are bonded between the first package 100 and the second package 200. In these embodiments, the underfill 220 includes a fillet where a sidewalls 220A that are diagonal to backside surfaces 120B of the dies 120. In some embodiments, the underfill 220 is formed to leave openings 222 over the dies 120.

FIG. 2C illustrates the semiconductor packages 300 being singulated. The semiconductor packages 300 may be removed from the frame 138 and placed over a structure 232, such as a dicing tape. The semiconductor packages 300 may be singulated by a cutting tool 234, such as a die saw, a laser, the like, or a combination thereof.

The numbers of the first packages 100 and the second packages 200 in FIGS. 1A through 1J and FIGS. 2A through 2C are only for illustrative purposes and are not limiting. There could be other number of packages that is more or less than the two packages illustrated.

Figure 3A:
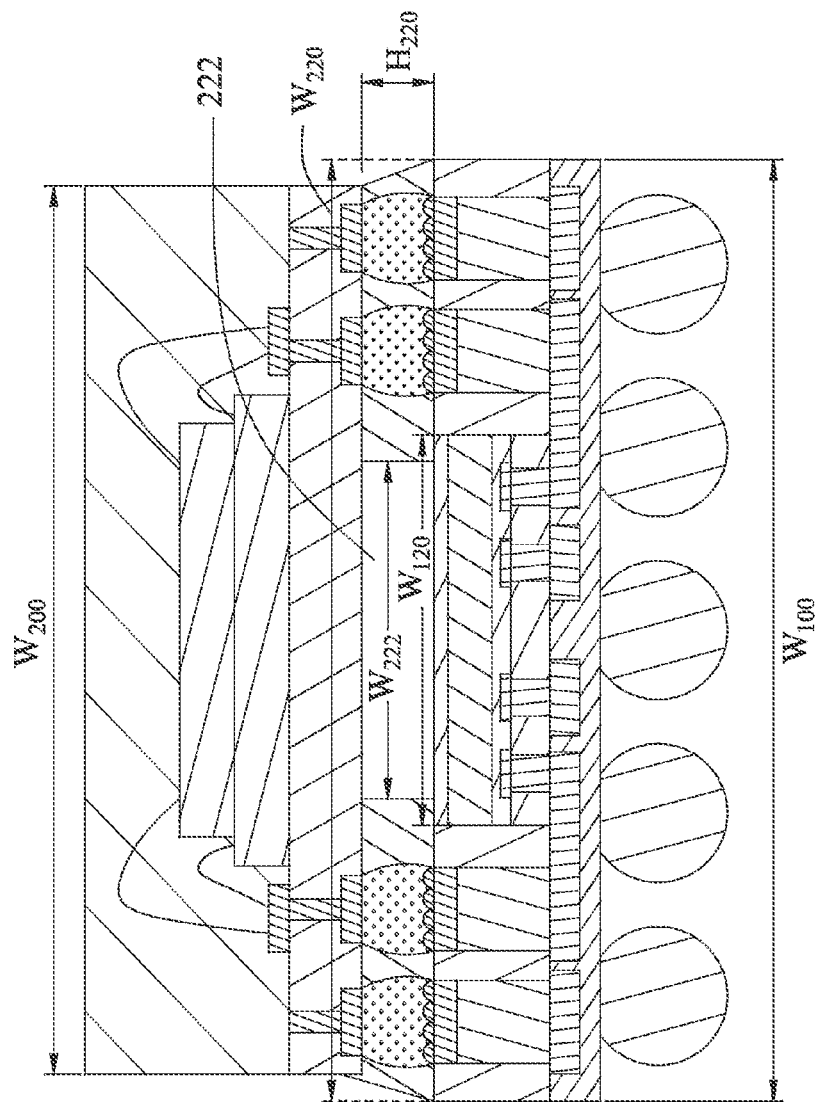
FIGS. 3A through 3C illustrate cross-sectional views of semiconductor packages in accordance with some embodiments.
Figure 3B:
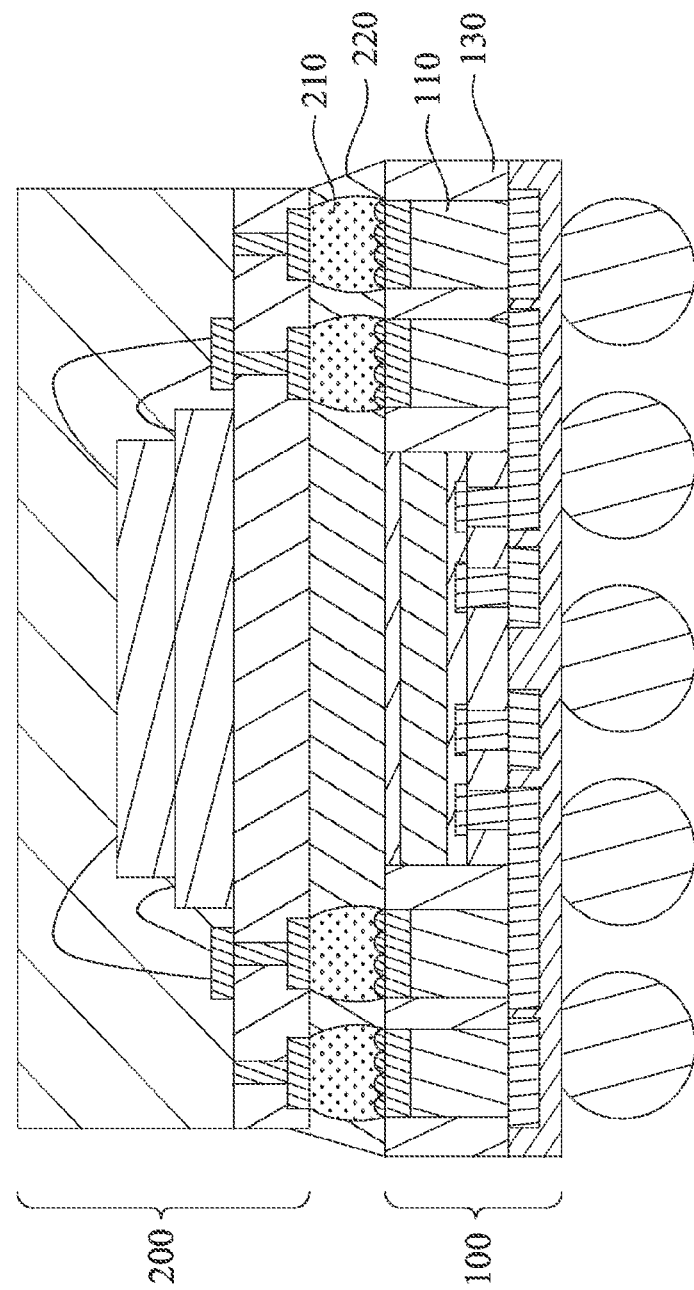
Figure 3C:
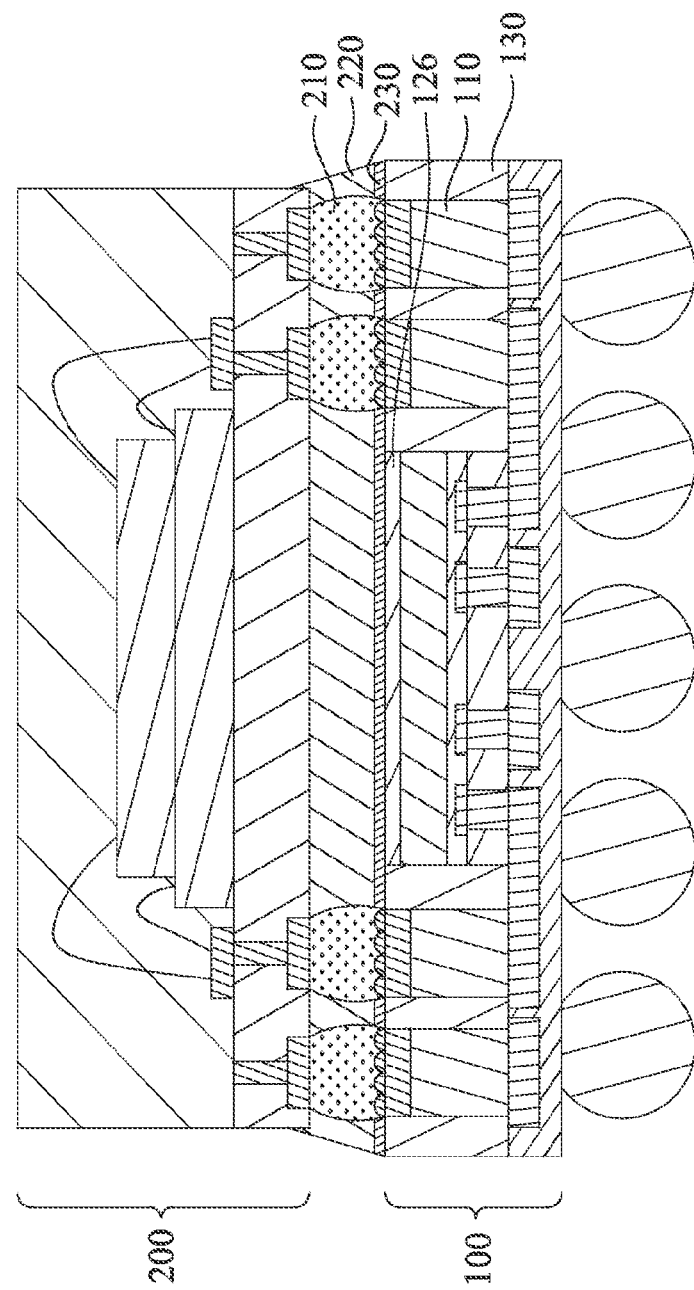

FIGS. 3A through 3C illustrate cross-sectional views of semiconductor packages 300 in accordance with some embodiments. Referring the FIG. 3A, this embodiment has the underfill 220 including fillets. The first package 100 has a width $W_{100}$, the second package has a width $W_{200}$, and the underfill 220 has an outer width $W_{220}$ between the first and second packages 100 and 200. The opening 222 in the underfill 220 has a width $W_{222}$ and the die 120 has a width $W_{120}$. In an embodiment, the width $W_{220}$ is less than or equal to the width $W_{100}$, the width $W_{200}$ is less than or equal to the width $W_{220}$, and the width $W_{222}$ is less than or equal to the width $W_{120}$. In another embodiment, the width $W_{220}$ is less than the width $W_{100}$, the width $W_{200}$ is less than the width $W_{220}$, and the width $W_{222}$ is less than the width $W_{120}$. The underfill 220 has a height $H_{220}$ between the first and second packages 100 and 200 (sometimes referred to as a standoff height). In an embodiment, the height $H_{220}$ is from about 1 μm to about 200 μm.

FIG. 3B illustrates another embodiment of the semiconductor package 300. This embodiment is similar to the previous embodiment of FIG. 3A except that that that there is no opening (see 222 in FIG. 3A) in the underfill 220. The opening 222 may be formed by only forming the underfill 220 around the outer edges of the semiconductor package 300 and not in the central area of the semiconductor package 300. Details regarding this embodiment that are similar to those for the previously described embodiment will not be repeated herein.

FIG. 3C illustrates another embodiment of the semiconductor package 300. This embodiment is similar to the previous embodiment of FIG. 3B except that that that there is a buffer layer 230 interposed between the first package 100 and the underfill 220. Details regarding this embodiment that are similar to those for the previously described embodiment will not be repeated herein.

The buffer layer 230 is formed over the die 120 (and the adhesive layer 126 if present), the TIVs 110, and the molding material 130. The buffer layer 230 may be formed of a polymer, such as polyimide, PBO, or the like. The buffer layer 230 may also be a LTHC material. In an embodiment, the buffer layer 230 is formed to have thickness from about 0.1 μm to about 20 μm.

By removing the dielectric layer 106 from the first package 100, the warpage of the first package 100 can be reduced, and thus, the coplanarity and standoff height control between the first package 100 and the second package 200 can be improved. In addition, the use of no-clean flux eliminates the issue of flux residue between the first package 100 and the second package 200. Further, by forming the underfill 220 before the singulating process, the conductive connectors 210 are protected from electrical failures (e.g. shorting between conductive connectors) caused by debris from the singulation process. Moreover, the contamination of the underfill between the two semiconductor packages 300 and also the issue of the underfill creeping up between the adjacent second packages 200 are prevented by having the second package 200 have a smaller width than the first package 100, which gives the underfill 220 more space between semiconductor packages 300.

Figure 4A:
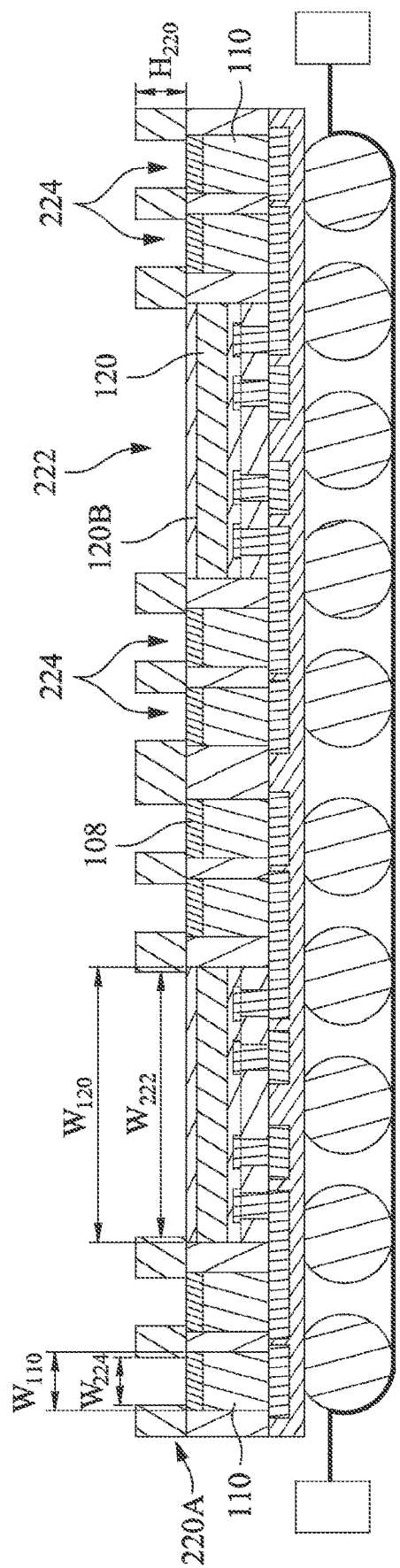
FIGS. 4A and 4B illustrate cross-sectional views of intermediate steps of forming semiconductor packages in accordance with some other embodiments.
Figure 4B:
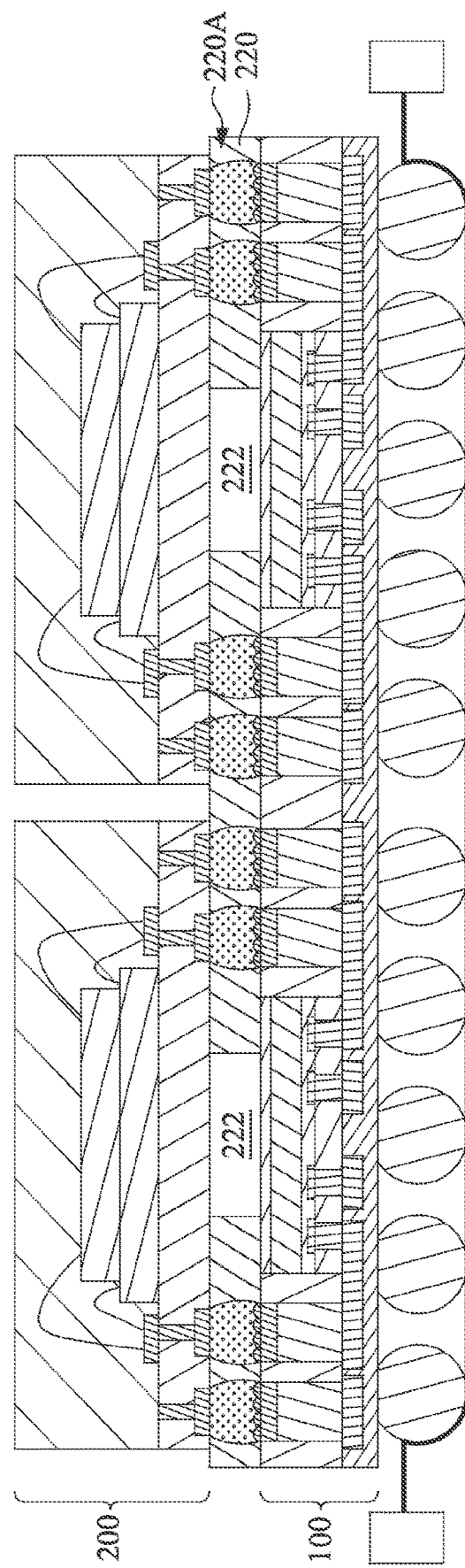

FIGS. 4A and 4B illustrate cross-sectional views of intermediate steps of forming semiconductor packages 300 in accordance with some other embodiments. This embodiment is similar to the previous embodiments in FIGS. 1A through 1J and 2A through 2C except that the underfill 220 is formed and patterned before the first package 100 is bonded to the second package 200. Details regarding this embodiment that are similar to those for the previously described embodiment will not be repeated herein.

FIG. 4A illustrates an intermediate manufacturing step after the steps illustrated in FIGS. 1A through 1J have already been completed. After the step in FIG. 1J, the underfill 220 is formed over the dies 120, the molding material 130, and the TIVs 110. The underfill 220 may be deposited by CVD, PVD, or ALD, formed by a wet process, such as a spin-on process, a screen printing process, or by a dry process, such as by rolling on a dry film. After the underfill 220 is formed, the underfill 220 is patterned to form openings 224 over the TIVs 110 to expose portions of the TIVs 110 (and seed layer 108 if present). In some embodiments, the underfill 220 is patterned to form openings 222 over the dies 120 (and adhesive layer 126 if present). The underfill 220 may be patterned by using acceptable photolithography techniques and etching, such as a laser etching process. The openings 222 are formed to have a width $W_{222}$ and the openings 224 are formed to a width $W_{224}$. In an embodiment, the width $W_{222}$ is less than or equal to the width $W_{120}$ and the width $W_{224}$ is less than or equal to a width $W_{110}$ of the TIVs 110. In another embodiment, the width $W_{222}$ is less than the width $W_{120}$ and the width $W_{224}$ is less than the width $W_{110}$. In an embodiment including the buffer layer 230 (see FIGS. 3C and 5C) the width of opening of the buffer layer 230 in the openings 224 is less than or equal to the width $W_{224}$. The underfill 220 may be formed to have the height $H_{220}$ from about 1 μm to about 200 μm. In this embodiment, the underfill 220 has sidewalls 220A that are substantially perpendicular to backside surfaces 120B of the dies 120. In some embodiments, the underfill 220 is patterned such that there is no underfill 220 in the scribe line between the adjacent first packages 100.

FIG. 4B illustrates attaching second packages 200 to the first package 100 of FIG. 4A. This is similar to the process described above in FIG. 2A, except that the underfill 220 is present during the bonding process. Details regarding this embodiment that are similar to those for the previously described embodiment will not be repeated herein. The packages 200 and 100 will then be singulated as described above in FIG. 2C.

Figure 5A:
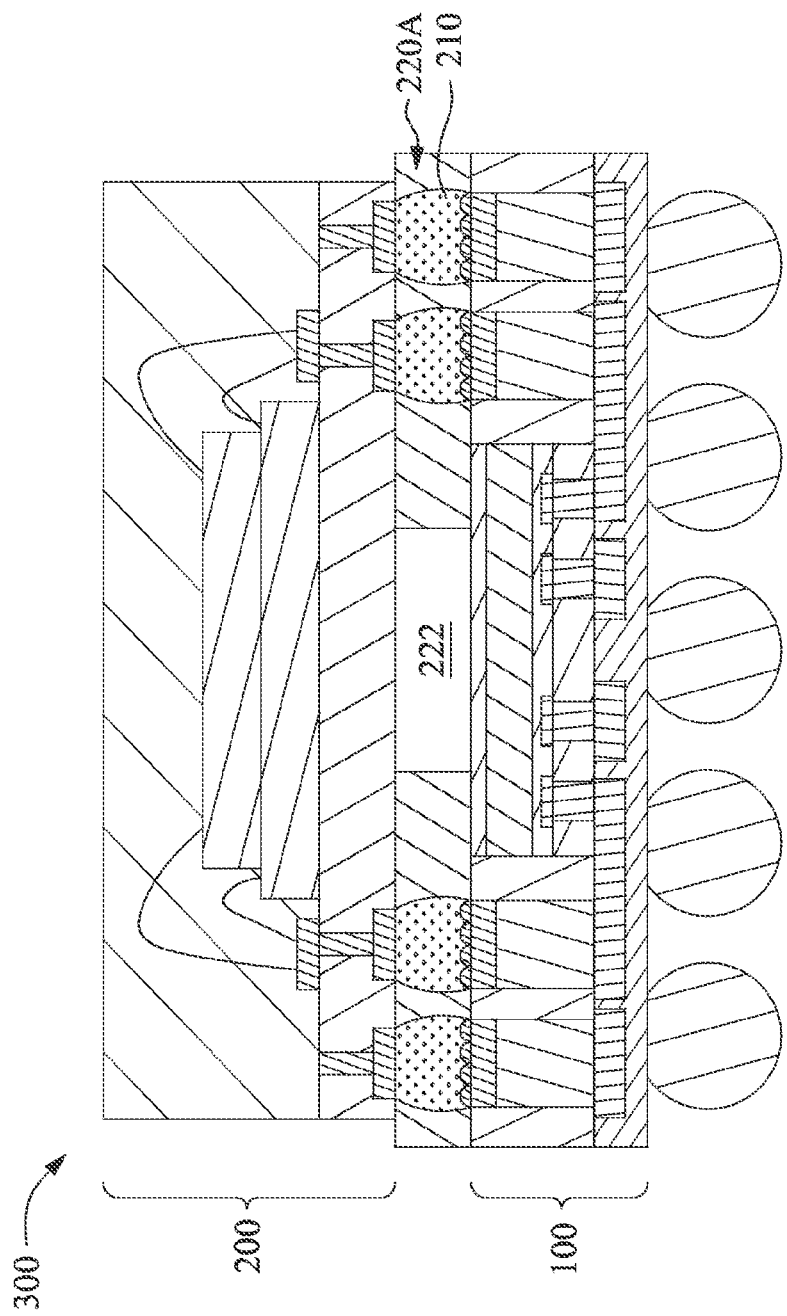
FIGS. 5A through 5C illustrate cross-sectional views of semiconductor packages in accordance with some other embodiments.
Figure 5B:
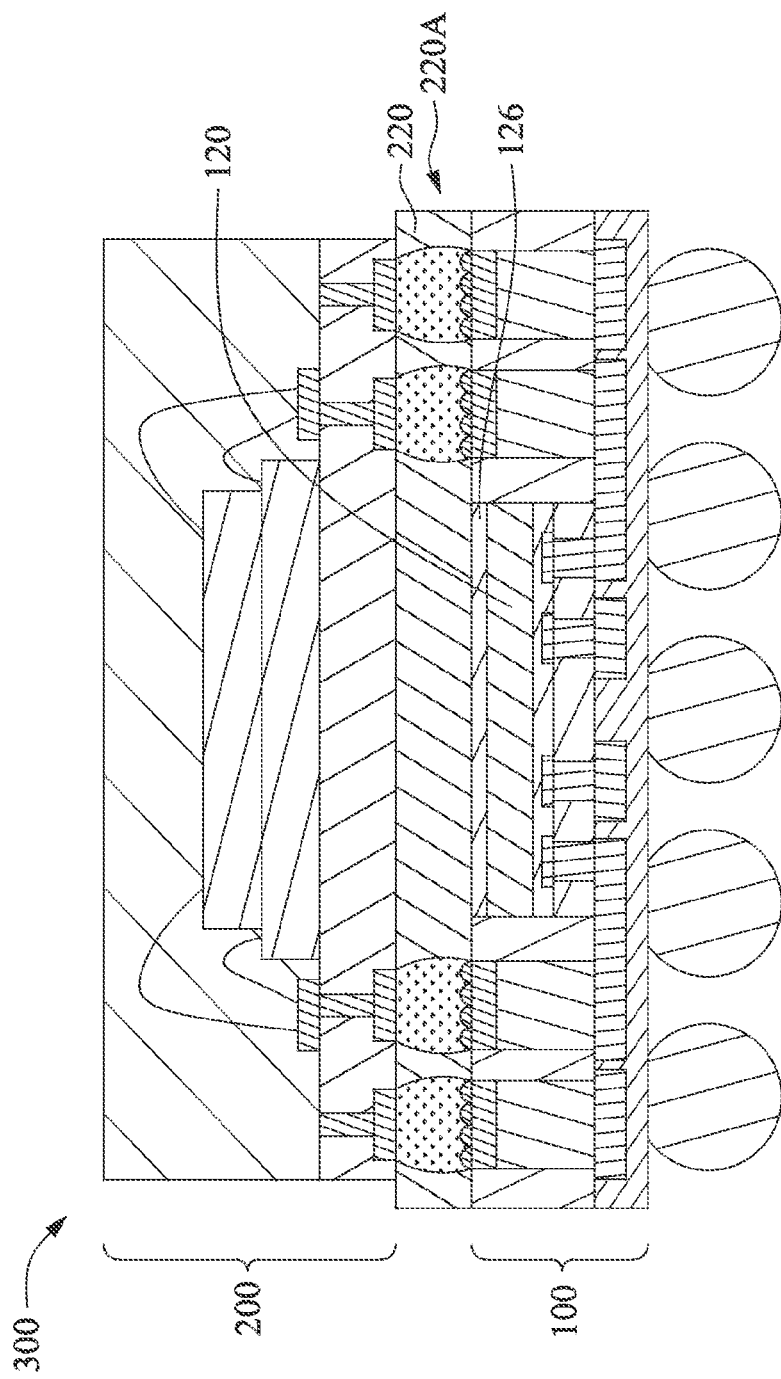
Figure 5C:
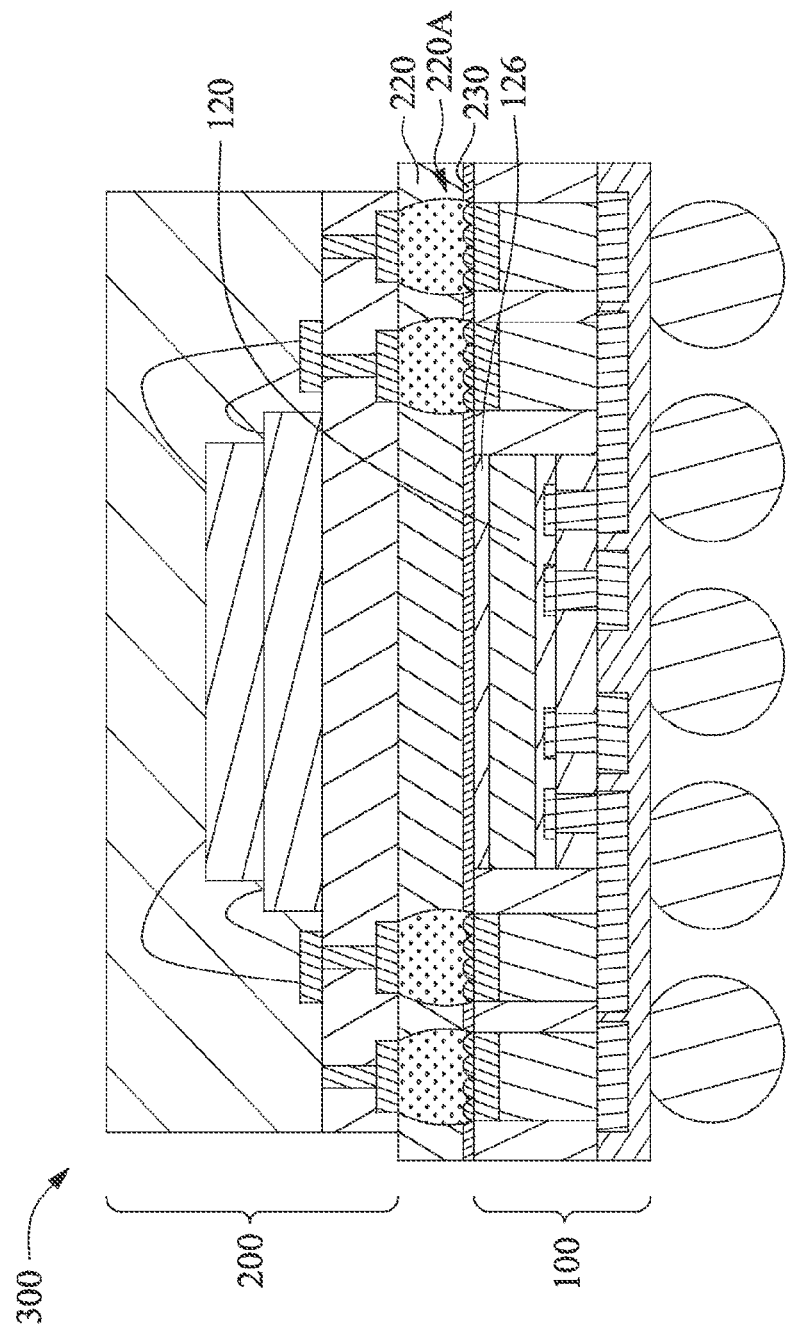

FIGS. 5A through 5C illustrate cross-sectional views of semiconductor packages 300 in accordance with some other embodiments. These embodiments are similar to the embodiments described above in FIGS. 3A through 3C except that these embodiments have underfill 220 formed before bonding the packages together and the sidewalls 220A of the underfill 220 are substantially perpendicular to the backside surface of the die 120 and does not have fillets. Details regarding this embodiment that are similar to those for the previously described embodiment will not be repeated herein.

Referring to FIG. 5A, the underfill 220 has the opening 222 over the die 120. FIG. 5B illustrates the underfill 220 having no opening over the die 120. FIG. 5C illustrates the semiconductor package 300 with the buffer layer 230 over the first package 100.

By removing the dielectric layer 106 from the first package 100 and forming the underfill 220 before bonding the packages, the warpage of the first package 100 can be reduced, and thus, the coplanarity and standoff height control between the first package 100 and the second package 200 can be improved. In addition, by forming the underfill 220 before the singulating process, the conductive connectors 210 are protected from electrical failures (e.g. shorting between conductive connectors) caused by debris from the singulation process. Moreover, the contamination of the underfill between the two semiconductor packages 300 is prevented and also the issue of the underfill creeping up between the adjacent second packages 200 by having the second package 200 have a smaller width than the first package 100, which gives the underfill 220 more space between semiconductor packages 300.

Figure 6:
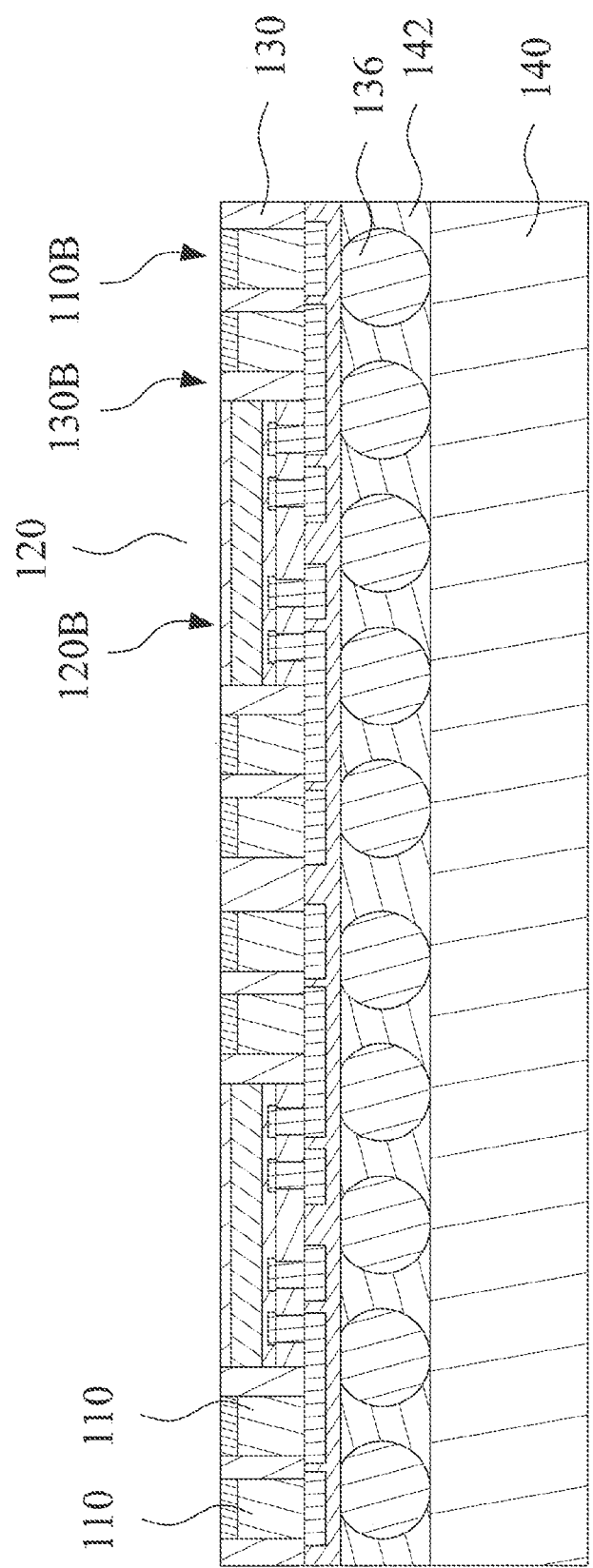
FIGS. 6, 7A, and 7B illustrate cross-sectional views of intermediate steps of forming semiconductor packages in accordance with some other embodiments.
Figure 7A:
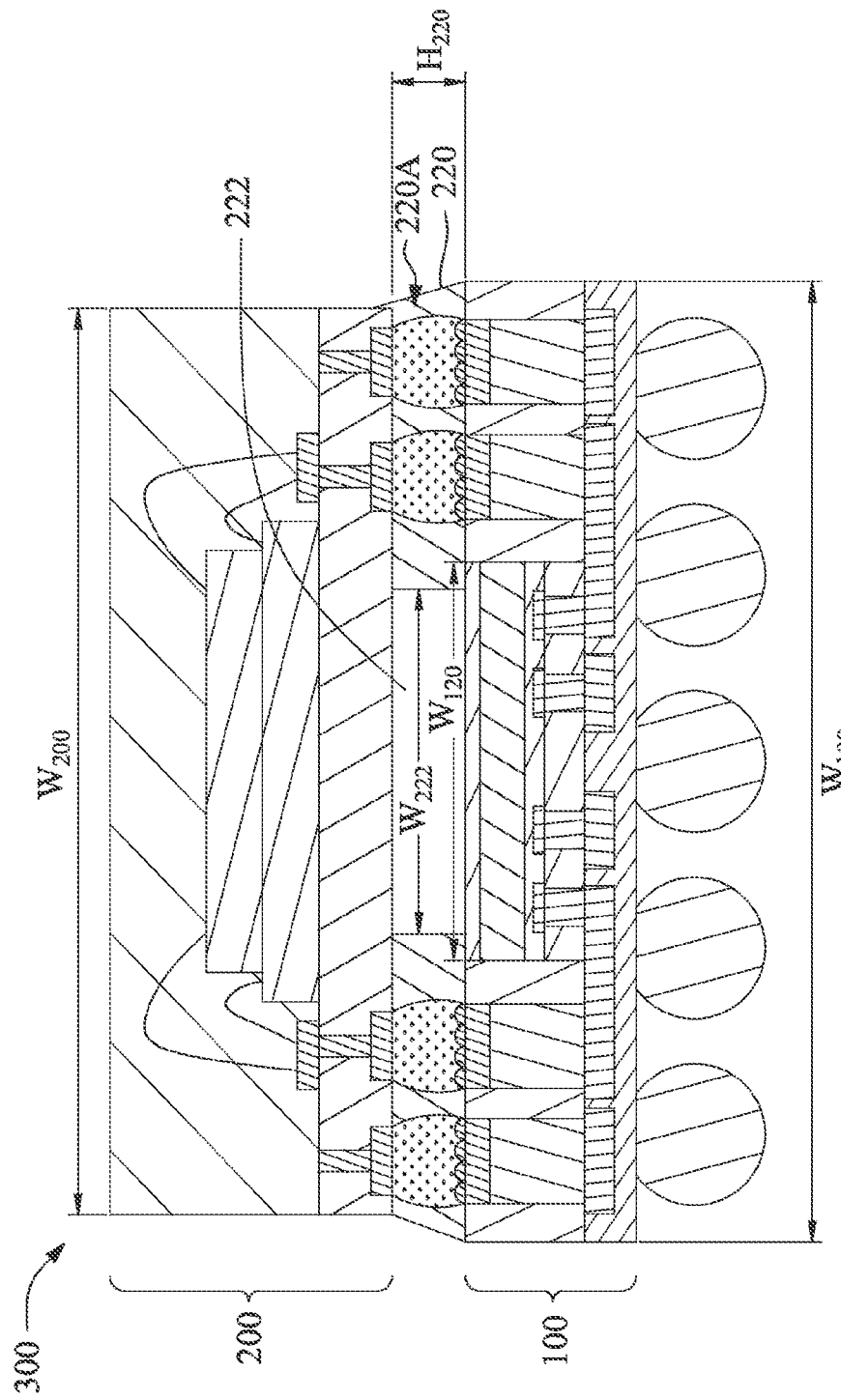
Figure 7B:
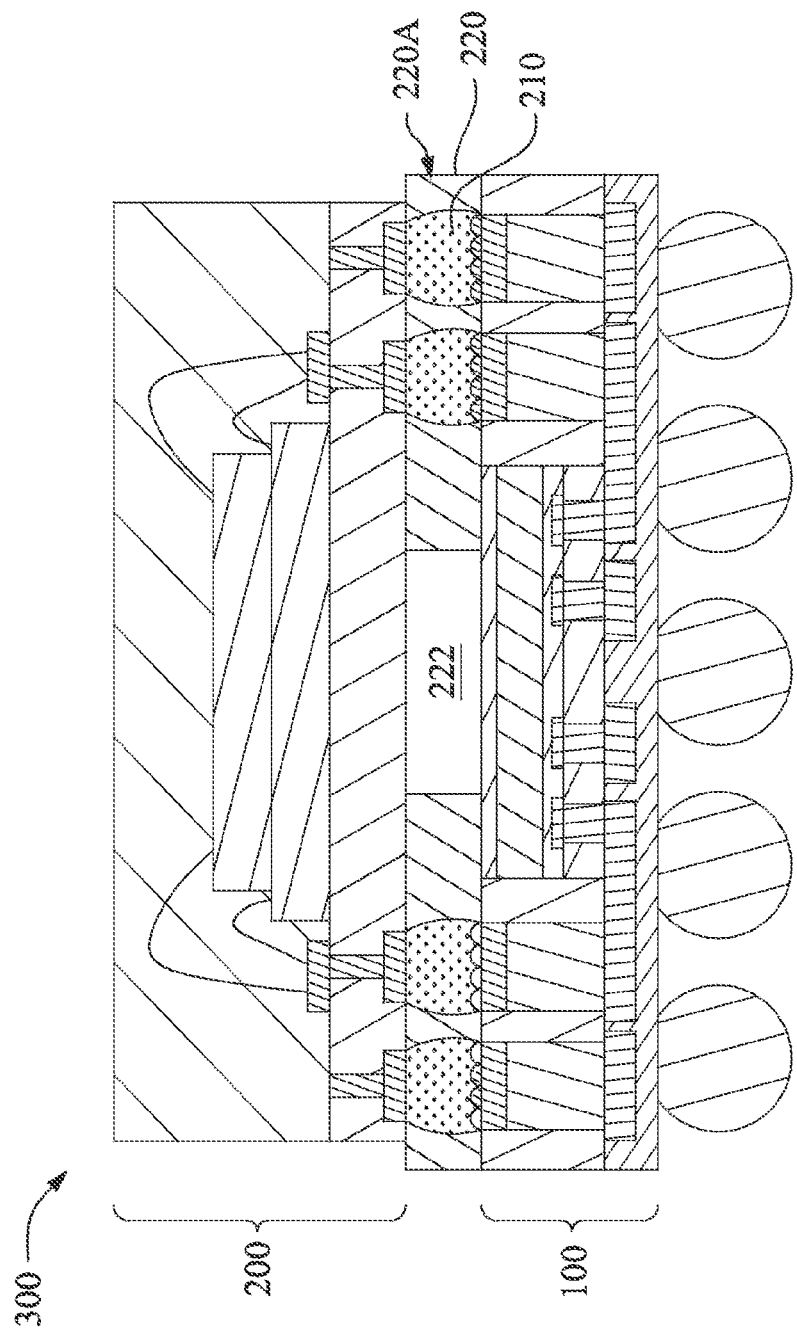

FIGS. 6, 7A, and 7B illustrate cross-sectional views of intermediate steps of forming semiconductor packages in accordance with some other embodiments. This embodiment is similar to the embodiment in FIG. 1J described above except that the dielectric layer 106 is removed with a grinding process rather than an etching process. Details regarding this embodiment that are similar to those for the previously described embodiment will not be repeated herein.

In this embodiment, the grinding process may be a chemical mechanical polishing (CMP) process. The grinding process may remove the seed layer 108 and the adhesive layer 126. In some embodiments, the surfaces 130B, 120B, and 110B are substantially coplanar. In some other embodiments, the surfaces 130B and 120B are substantially coplanar the surfaces 110B are recessed into the molding material 130.

The processing of this embodiment can continue with attaching second packages 200 and singulation as described in FIGS. 2A through 2C. This embodiment can employ either underfill scheme as outlined in FIGS. 2A through 3C and FIGS. 4A and 5C.

FIG. 7A illustrates a cross-sectional view of a semiconductor package 300 from the first package 100 in FIG. 6 with the filleted underfill scheme from FIGS. 2A through 3C. Although the underfill 220 is shown with the opening 222, the opening 222 can be omitted. FIG. 7B illustrates a cross-sectional view of a semiconductor package 300 from the first package 100 in FIG. 6 with the non-filleted underfill scheme from FIGS. 4A through 5C.

Figure 8:
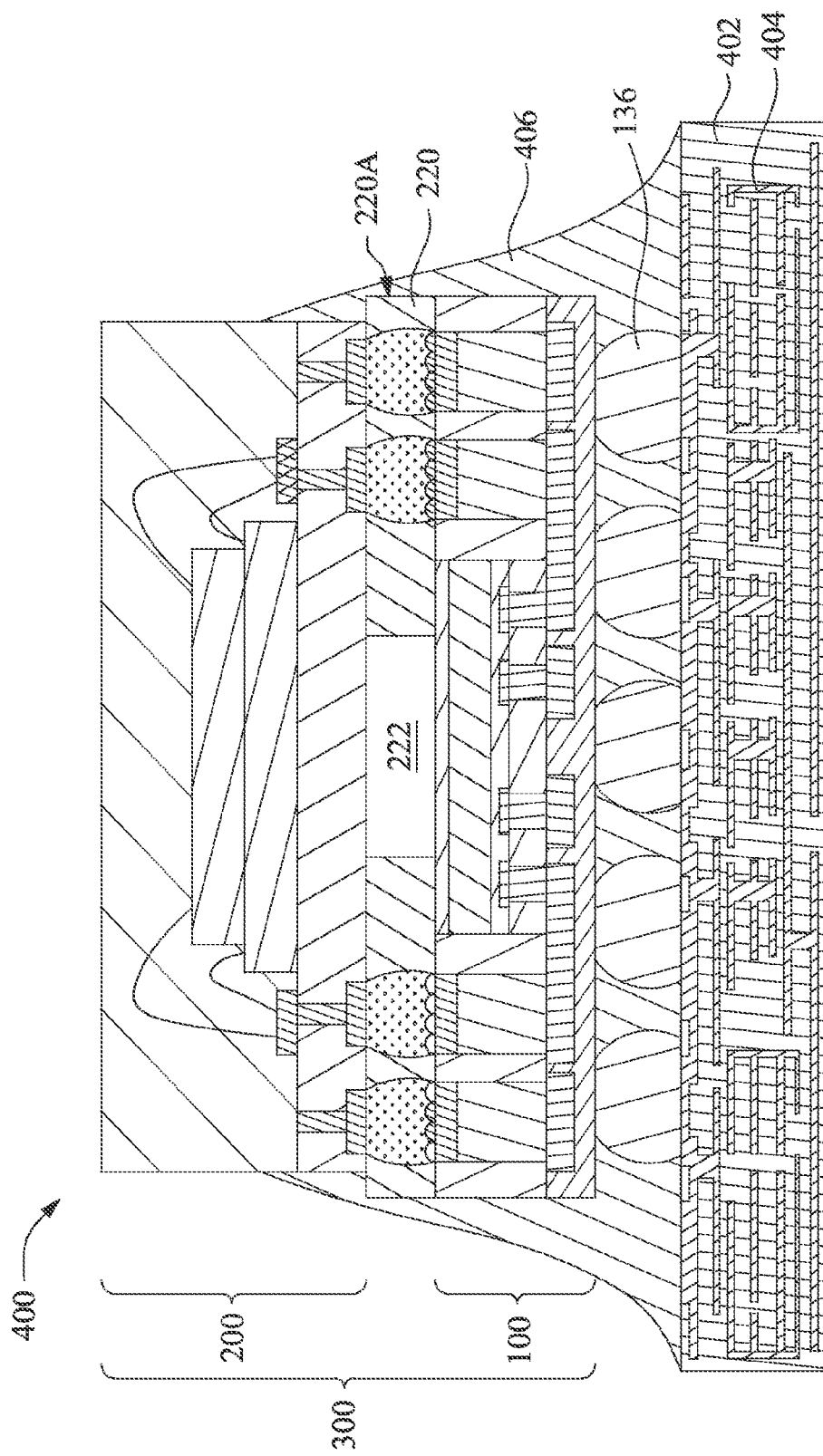
FIG. 8 illustrates a cross-sectional view of a semiconductor package in accordance with some embodiments.

FIG. 8 illustrates a cross-sectional view of a semiconductor package 400 in accordance with some embodiments. The semiconductor package 400 includes the semiconductor package 300 being mounted to a package substrate 402. The semiconductor package 300 may be any of the embodiments of the semiconductor package 300 described above. The semiconductor package 300 is mounted to the package substrate 402 using the conductive connectors 136.

The package substrate 402 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the package substrate 402 may be a SOI substrate. Generally, an SOI substrate includes a layer of a semiconductor material such as epitaxial silicon, germanium, silicon germanium, SOI, SGOI, or combinations thereof. The package substrate 402 is, in one alternative embodiment, based on an insulating core such as a fiberglass reinforced resin core. One example core material is fiberglass resin such as FR4. Alternatives for the core material include bismaleimide-triazine BT resin, or alternatively, other PCB materials or films. Build up films such as ABF or other laminates may be used for package substrate 402.

The package substrate 402 may include active and passive devices (not shown in FIG. 8). As one of ordinary skill in the art will recognize, a wide variety of devices such as transistors, capacitors, resistors, combinations of these, and the like may be used to generate the structural and functional requirements of the design for the semiconductor package 400. The devices may be formed using any suitable methods.

The package substrate 402 may also include metallization layers and vias 404. The metallization layers 404 may be formed over the active and passive devices and are designed to connect the various devices to form functional circuitry. The metallization layers 404 may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the package substrate 402 is substantially free of active and passive devices.

The semiconductor package 400 includes an underfill 406 between the semiconductor package 300 and the substrate 402 and between the conductive connectors 136. The underfill 406 may be formed of a liquid epoxy, a deformable gel, a silicon rubber, a non-conductive film, a polymer, PBO, polyimide, solder resist, or a combination thereof. The underfill 406 provides structural support for the conductive connectors 136, and may be dispensed using capillary force after the conductive connectors 136 are bonded between the semiconductor package 300 and the substrate 402. In these embodiments, the underfill 406 includes a fillet and may extend up the semiconductor package to adjoin sidewalls of the first package 100, the underfill 220, and the second package 200.

By removing the dielectric layer from the first package and forming the underfill before bonding the packages, the warpage of the first package can be reduced, and thus, the coplanarity and standoff height control between the first package and the second package can be improved. In addition, by forming the underfill before the singulating process, the conductive connectors are protected from electrical failures (e.g. shorting between conductive connectors) caused by debris from the singulation process. Moreover, the contamination of the underfill between the two semiconductor packages is prevented and also the issue of the underfill creeping up between the adjacent second packages by having the second package have a smaller width than the first package, which gives the underfill more space between semiconductor packages.

An embodiment is a method including forming a first package. The forming the first package including forming a first dielectric layer over a carrier substrate, forming a first electrical connector over the first dielectric layer, attaching a first die adjacent the first electrical connector and over the first dielectric layer, forming a redistribution layer over the first die and the first electrical connector, forming a second electrical connector over the redistribution layer, the second electrical connector being coupled to at least one of the first die and the first electrical connector, removing the carrier substrate to expose the first dielectric layer, and removing the first dielectric layer to expose portions of the first die and the first electrical connector. The method further including bonding a second package to the first package with a bonding structure, the bonding structure being coupled to the first electrical connector, and forming an underfill between the first package and the second package.

Another embodiment is a method including forming a first die package, the first die package including a first die, a first electrical connector, and a first redistribution layer, the first redistribution layer being coupled to the first die and the first electrical connector, forming an underfill over the first die package, patterning the underfill to have an opening to expose a portion of the first electrical connector, and bonding a second die package to the first die package with a bonding structure, the bonding structure being coupled to the first electrical connector in the opening of the underfill.

A further embodiment is a semiconductor package including a first package. The first package including a first die, an encapsulant surrounding the first die, and a through package via extending through the encapsulant. The semiconductor package further including a second package comprising a second die, the second package being bonded to the first package by a set of connectors, and an underfill between the first package and the second package and surrounding the set of connectors, the underfill having sidewalls that are substantially perpendicular to a backside surface of the first die.

A further embodiment is a package including a first package. The first package includes a first die, an encapsulant extending along sidewalls of the first die, and a plurality of conductive columns extending through the encapsulant. The package further includes a second package bonded to the first package. The second package includes a second die bonded to a first surface of a first substrate. The package further includes a first underfill between the first package and the second package. The first underfill has a first opening between the first die and the first substrate. At least a portion of a second surface of the first substrate is exposed in the first opening. The second surface of the first substrate is opposite the first surface of the first substrate. The package further includes a plurality of first connectors extending through the first underfill. The plurality of first connectors electrically couple the plurality of conductive columns to the first substrate.

A further embodiment is a package including a first package. The first package includes a first die having an active surface and a backside surface opposite the active surface, the backside surface of the first die having a first width, a molding material surrounding the first die, surfaces of the molding material being level with the active surface and the backside surface of the first die, a conductive column extending through the molding material, and a redistribution layer coupled to the first die and the conductive column. The active surface of the first die is closer to the redistribution layer than the backside surface of the first die. The package further includes a second package comprising a second die attached to a first substrate, the second package being bonded to the first package by a plurality of first connectors. The package further includes a first underfill between the first package and the first substrate. The first underfill surrounds the plurality of first connectors. The first underfill has a first opening exposing at least a portion of a first surface of the first substrate. The first surface of the first substrate faces the backside surface of the first die. The first opening has a second width less than the first width.

A further embodiment is a package including a first package. The first package includes a first die having an active surface and a backside surface opposite the active surface, the backside surface including a die attach film, a molding material surrounding the first die, surfaces of the molding material being level with the active surface and the backside surface of the first die, and a first redistribution layer coupled to the first die. The package further includes a second package comprising a second die. The second package is bonded to the first package by a plurality of connectors. The first die is interposed between the first redistribution layer and the second package. The package further includes an underfill between the first package and the second package. The underfill surrounds the plurality of connectors. The underfill has a first opening exposing at least a portion of the die attach film and at least a portion of a surface of the second package. The surface of the second package faces the die attach film.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package comprising:
   a first package comprising:
      a first die;
      an encapsulant extending along sidewalls of the first die; and
      a plurality of conductive columns extending through the encapsulant;
   a second package bonded to the first package, the second package comprising a second die bonded to a first surface of a first substrate;
   a first underfill between the first package and the second package, the first underfill having a first opening between the first die and the first substrate, a width of the first opening being less than a width of the second die, the width of the first opening being less than a width of the first die, at least a portion of a second surface of the first substrate being exposed in the first opening, the second surface of the first substrate being opposite the first surface of the first substrate; and
   a plurality of first connectors extending through the first underfill, the plurality of first connectors electrically coupling the plurality of conductive columns to the first substrate.

2. The package of claim 1, wherein at least a portion of a surface of the first die is exposed in the first opening, the surface of the first die facing the second surface of the first substrate.

3. The package of claim 1, wherein the first package further comprises a redistribution structure, the first die being interposed between the redistribution structure and the first substrate.

4. The package of claim 3, further comprising a second substrate bonded to the redistribution structure.

5. The package of claim 4, further comprising a second underfill between the second substrate and the redistribution structure, the second underfill extending along a sidewall of the first package and a sidewall of the second package, the second underfill being in physical contact with a sidewall and a top surface of the first underfill.

6. The package of claim 5, further comprising a plurality of second connectors extending through the second underfill, the plurality of second connectors electrically coupling the redistribution structure to the second substrate.

7. The package of claim 1, wherein a height of the first underfill is between about 1 μm to about 200 μm.

8. A package comprising:
   a first package comprising:
      a first die having an active surface and a backside surface opposite the active surface, the backside surface of the first die having a first width;
      a molding material surrounding the first die, surfaces of the molding material being level with the active surface and the backside surface of the first die;
      a conductive column extending through the molding material; and
      a redistribution layer coupled to the first die and the conductive column, the active surface of the first die being closer to the redistribution layer than the backside surface of the first die;
   a second package comprising a second die attached to a first substrate, the second package being bonded to the first package by a plurality of first connectors; and
   a first underfill between the first package and the first substrate, the first underfill surrounding the plurality of first connectors, a sidewall of the first underfill being coplanar with a sidewall of the molding material, the first underfill having a first opening exposing at least a portion of a first surface of the first substrate, the first surface of the first substrate facing the backside surface of the first die, the first opening having a second width less than the first width.

9. The package of claim 8, further comprising a second substrate bonded to the redistribution layer, the redistribution layer being interposed between the second substrate and the first die.

10. The package of claim 9, further comprising a plurality of second connectors between the redistribution layer and the second substrate, the plurality of second connectors electrically coupling the second substrate to the first package.

11. The package of claim 10, further comprising a second underfill surrounding the plurality of second connectors, the second underfill being in physical contact with the sidewall of the molding material, a sidewall of the first substrate and the sidewall of the first underfill.

12. The package of claim 8, wherein a height of the first opening is equal to a thickness of the first underfill.

13. The package of claim 12, wherein the height of the first opening is between about 1 μm to about 200 μm.

14. The package of claim 8, wherein at least a portion of the backside surface of the first die is exposed in the first opening.

15. A package comprising:
   a first package comprising:
      a first die having an active surface and a backside surface opposite the active surface, the backside surface including a die attach film;
      a molding material surrounding the first die, surfaces of the molding material being level with the active surface and the backside surface of the first die; and
      a first redistribution layer coupled to the first die;
   a second package comprising a second die, the second package being bonded to the first package by a plurality of connectors, the first die being interposed between the first redistribution layer and the second package; and
   an underfill between the first package and the second package, the underfill surrounding the plurality of connectors, a sidewall of the underfill being coplanar with a sidewall of the first redistribution layer, the underfill having a first opening exposing at least a portion of the die attach film and at least a portion of a surface of the second package, the surface of the second package facing the die attach film.

16. The package of claim 15, wherein a width of the first die is greater than a width of the first opening.

17. The package of claim 15, wherein a width of the first package is greater than a width of the second package.

18. The package of claim 15, further comprising a conductive column extending through the molding material, the conductive column being in physical contact with the first redistribution layer.

19. The package of claim 15, wherein the first opening is interposed between a first connector of the plurality of connectors and a second connector of the plurality of connectors.

20. The package of claim 15, wherein a width of the underfill is greater than a width of the second package.

* * * * *